US010189562B2

(12) United States Patent
Wang et al.

(10) Patent No.: US 10,189,562 B2
(45) Date of Patent: Jan. 29, 2019

(54) UNMANNED AERIAL VEHICLE AND OPERATIONS THEREOF

(71) Applicant: SZ DJI TECHNOLOGY CO., LTD, Shenzhen (CN)

(72) Inventors: Tao Wang, Shenzhen (CN); Tao Zhao, Shenzhen (CN); Shaojie Chen, Shenzhen (CN); Zhigang Ou, Shenzhen (CN)

(73) Assignee: SZ DJI Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/947,650

(22) Filed: Apr. 6, 2018

(65) Prior Publication Data

US 2018/0229834 A1    Aug. 16, 2018

Related U.S. Application Data

(63) Continuation of application No. 15/175,473, filed on Jun. 7, 2016, which is a continuation of application
(Continued)

(30) Foreign Application Priority Data

Nov. 15, 2012 (CN) .......................... 2012 2 0604396
Dec. 13, 2012 (CN) .......................... 2012 2 0686731

(51) Int. Cl.
*B64D 43/00* (2006.01)
*B64C 27/08* (2006.01)
(Continued)

(52) U.S. Cl.
CPC ............... *B64C 27/08* (2013.01); *B64C 1/30* (2013.01); *B64C 25/06* (2013.01); *B64C 25/32* (2013.01);
(Continued)

(58) Field of Classification Search
CPC ............ B64C 2201/04; B64C 2201/20; B64C 2201/201; B64C 2201/203; A63H 27/12
See application file for complete search history.

(56) References Cited

U.S. PATENT DOCUMENTS 1,573,228 A    2/1926    Bothezat
2,427,374 A    9/1947    Walker
(Continued)

FOREIGN PATENT DOCUMENTS

CN    1583510 A    2/2005
CN    1807185 A    7/2006
(Continued)

OTHER PUBLICATIONS

APM Automatic Drive Set, APM Chinese Website, (Evidence 34 of Request for Patent Right Invalidation Case No. 5W112895 for Chinese U.S. Pat. No. 201220686731.2) http://ardupilot.cn/.
(Continued)

*Primary Examiner* — Philip J Bonzell
*Assistant Examiner* — Michael B. Kreiner
(74) *Attorney, Agent, or Firm* — Perkins Coie LLP

(57) ABSTRACT

The present invention provides methods and apparatus for unmanned aerial vehicles (UAVs) with improved reliability. According to one aspect of the invention, interference experienced by onboard sensors from onboard electrical components is reduced. According to another aspect of the invention, user-configuration or assembly of electrical components is minimized to reduce user errors.

19 Claims, 8 Drawing Sheets

Related U.S. Application Data

No. 15/012,006, filed on Feb. 1, 2016, now Pat. No. 9,394,048, which is a continuation of application No. 14/954,427, filed on Nov. 30, 2015, now Pat. No. 9,284,049, which is a continuation of application No. 14/836,344, filed on Aug. 26, 2015, now Pat. No. 9,233,754, said application No. 15/012,006 is a continuation of application No. 14/947,923, filed on Nov. 20, 2015, now Pat. No. 9,321,530, which is a continuation of application No. 14/836,344, filed on Aug. 26, 2015, now Pat. No. 9,233,754, which is a continuation of application No. 14/515,357, filed on Oct. 15, 2014, now Pat. No. 9,221,536, which is a continuation of application No. 14/092,653, filed on Nov. 27, 2013, now Pat. No. 9,016,617, which is a continuation-in-part of application No. PCT/CN2013/087053, filed on Nov. 13, 2013.

(51) Int. Cl.

| | | |
|---|---|---|
| *B64C 39/02* | (2006.01) | |
| *G01V 3/16* | (2006.01) | |
| *B64C 25/06* | (2006.01) | |
| *B64C 27/00* | (2006.01) | |
| *G05D 1/00* | (2006.01) | |
| *B64C 27/54* | (2006.01) | |
| *B64C 1/30* | (2006.01) | |
| *B64C 25/32* | (2006.01) | |
| *B64D 31/14* | (2006.01) | |
| *G01R 33/00* | (2006.01) | |
| *A63H 27/00* | (2006.01) | |

(52) U.S. Cl.
CPC .............. *B64C 27/00* (2013.01); *B64C 27/54* (2013.01); *B64C 39/024* (2013.01); *B64D 31/14* (2013.01); *B64D 43/00* (2013.01); *G01R 33/0047* (2013.01); *G01V 3/16* (2013.01); *G05D 1/00* (2013.01); *A63H 27/12* (2013.01); *B64C 2025/325* (2013.01); *B64C 2201/024* (2013.01); *B64C 2201/027* (2013.01); *B64C 2201/042* (2013.01); *B64C 2201/108* (2013.01); *B64C 2201/12* (2013.01); *B64C 2201/123* (2013.01); *B64C 2201/127* (2013.01); *B64C 2201/128* (2013.01); *B64C 2201/14* (2013.01); *B64C 2201/141* (2013.01); *B64C 2201/20* (2013.01); *Y10T 29/49117* (2015.01)

(56) References Cited

U.S. PATENT DOCUMENTS

| | | | |
|---|---|---|---|
| 2,469,144 A * | 5/1949 | Baggott | A63H 17/266 446/232 |
| 3,053,480 A | 9/1962 | Vanderlip | |
| 3,108,220 A | 10/1963 | Ruddock | |
| 3,123,766 A * | 3/1964 | Ruddock et al. | G01V 3/165 244/118.1 |
| 3,185,410 A | 5/1965 | Smart | |
| 3,211,399 A | 10/1965 | Eickmann | |
| 3,253,806 A | 5/1966 | Eickmann | |
| 3,345,016 A | 10/1967 | Eickmann | |
| 3,409,248 A | 11/1968 | Bryan | |
| 3,485,151 A * | 12/1969 | Taylor | B64D 47/08 244/137.4 |
| 3,530,375 A | 9/1970 | Fransiscus | |
| 3,590,636 A | 7/1971 | William | |
| 3,604,660 A * | 9/1971 | Marley | B64C 27/32 244/17.11 |
| 3,663,953 A | 5/1972 | Salvi | |
| 3,749,333 A | 7/1973 | Lykken | |
| 3,768,757 A | 10/1973 | Eickmann | |
| 3,794,273 A | 2/1974 | Girard | |
| 3,976,937 A * | 8/1976 | Hearn | G01V 3/165 324/331 |
| 4,173,321 A | 11/1979 | Eickmann | |
| 4,786,008 A | 11/1988 | Corbett | |
| 4,795,111 A * | 1/1989 | Moller | B64C 27/00 244/100 R |
| 4,799,629 A | 1/1989 | Mori | |
| 4,806,865 A * | 2/1989 | Oury | G01V 3/15 324/245 |
| 5,067,674 A * | 11/1991 | Heyche | G05D 1/0011 244/190 |
| 5,082,079 A | 1/1992 | Lissaman | |
| 5,575,438 A | 11/1996 | Mcgonigle et al. | |
| 5,823,468 A | 10/1998 | Bothe et al. | |
| 6,260,796 B1 | 7/2001 | Klingensmith | |
| 6,460,859 B1 | 10/2002 | Hammi et al. | |
| 6,467,065 B1 * | 10/2002 | Mendez | G05B 19/0421 710/31 |
| D465,196 S | 11/2002 | Michael | |
| 6,502,787 B1 | 1/2003 | Barrett | |
| 6,539,290 B1 * | 3/2003 | Vos | G05B 9/02 244/181 |
| 6,588,701 B2 * | 7/2003 | Yavnai | G05D 1/0038 244/12.1 |
| 6,612,893 B2 | 9/2003 | Rehkemper et al. | |
| 6,626,078 B2 | 9/2003 | Thornton | |
| 6,629,172 B1 * | 9/2003 | Andersson | G06F 13/4291 710/104 |
| 6,688,936 B2 | 2/2004 | Davis | |
| 6,726,148 B2 * | 4/2004 | Carroll | B64C 39/024 206/335 |
| 6,745,981 B1 * | 6/2004 | Rainer | B64C 1/36 244/118.1 |
| 6,842,006 B2 * | 1/2005 | Conti | G01V 3/15 324/348 |
| 6,927,702 B2 | 8/2005 | Wiplinger | |
| 7,002,349 B2 | 2/2006 | Barringer | |
| 7,210,654 B1 | 5/2007 | Cox et al. | |
| 7,274,868 B2 * | 9/2007 | Segal | A63H 27/12 396/12 |
| 7,658,346 B2 | 2/2010 | Goossen | |
| D628,658 S | 12/2010 | Wurm | |
| D648,808 S | 11/2011 | Seydoux et al. | |
| D659,771 S | 5/2012 | Seydoux et al. | |
| 8,172,173 B2 * | 5/2012 | Carlson | B64D 19/02 244/138 A |
| 8,225,021 B2 * | 7/2012 | Adkins | G06F 13/4291 710/110 |
| 8,322,648 B2 | 12/2012 | Kroetsch et al. | |
| 8,493,068 B2 * | 7/2013 | Morrison | B64D 3/00 324/330 |
| D691,514 S | 10/2013 | Tao et al. | |
| 8,594,862 B2 | 11/2013 | Callou et al. | |
| 8,774,982 B2 | 7/2014 | Oakley et al. | |
| D710,454 S | 8/2014 | Barajas et al. | |
| 8,973,861 B2 * | 3/2015 | Zhou | A63H 27/12 244/17.23 |
| 9,004,973 B2 * | 4/2015 | Condon | A63H 13/00 446/37 |
| 9,016,617 B2 * | 4/2015 | Wang | B64C 39/024 244/17.17 |
| 9,221,536 B2 * | 12/2015 | Wang | B64C 39/024 |
| 9,221,537 B2 * | 12/2015 | Wang | B64C 39/024 |
| 9,233,754 B1 * | 1/2016 | Wang | B64C 39/024 |
| 9,284,049 B1 * | 3/2016 | Wang | B64C 39/024 |
| 9,321,530 B2 | 4/2016 | Wang et al. | |
| 9,394,048 B2 | 7/2016 | Wang et al. | |
| 9,527,588 B1 | 12/2016 | Rollefstad | |
| 9,878,257 B2 | 1/2018 | Barrett et al. | |
| 2002/0142699 A1 * | 10/2002 | Davis | A63H 27/04 446/37 |
| 2003/0135327 A1 | 7/2003 | Levine et al. | |
| 2004/0257441 A1 * | 12/2004 | Pevear | B64D 47/08 348/144 |

(56) References Cited

U.S. PATENT DOCUMENTS

| | | | |
|---|---|---|---|
| 2005/0178879 A1 | 8/2005 | Mao et al. | |
| 2006/0226281 A1 | 10/2006 | Walton | |
| 2007/0105474 A1 | 5/2007 | Gotou et al. | |
| 2008/0048065 A1 | 2/2008 | Kuntz | |
| 2008/0125920 A1* | 5/2008 | Miles | B64C 39/024 701/2 |
| 2008/0152494 A1* | 6/2008 | Froman | B64D 15/12 416/95 |
| 2008/0307131 A1* | 12/2008 | Simon | G06F 12/0661 710/105 |
| 2009/0117812 A1 | 5/2009 | Van et al. | |
| 2009/0134273 A1 | 5/2009 | Page et al. | |
| 2009/0283629 A1 | 11/2009 | Kroetsch et al. | |
| 2009/0284258 A1* | 11/2009 | Morrison | B64B 1/02 324/330 |
| 2009/0284644 A1 | 11/2009 | McKaughan et al. | |
| 2010/0243794 A1 | 9/2010 | Jermyn et al. | |
| 2011/0019558 A1* | 1/2011 | Rowe | H04L 43/0858 370/252 |
| 2011/0301784 A1* | 12/2011 | Oakley | B64C 27/04 701/2 |
| 2012/0012700 A1* | 1/2012 | Eriksen | B64C 25/28 244/100 R |
| 2012/0043411 A1 | 2/2012 | Beck et al. | |
| 2012/0056041 A1 | 3/2012 | Rhee et al. | |
| 2012/0083945 A1* | 4/2012 | Oakley | B64C 27/08 701/2 |
| 2012/0089274 A1 | 4/2012 | Lee et al. | |
| 2012/0138732 A1 | 6/2012 | Olm et al. | |
| 2012/0212228 A1* | 8/2012 | Cho | B82Y 25/00 324/331 |
| 2012/0223181 A1* | 9/2012 | Ciampa | B64B 1/62 244/30 |
| 2012/0287274 A1 | 11/2012 | Bevirt | |
| 2012/0330481 A1* | 12/2012 | Feldkamp | G06F 17/00 701/2 |
| 2013/0068892 A1* | 3/2013 | Bin Desa | B64C 39/024 244/190 |
| 2013/0110325 A1 | 5/2013 | Sapp, II et al. | |
| 2014/0008496 A1 | 1/2014 | Ye et al. | |
| 2014/0117149 A1 | 5/2014 | Zhou et al. | |
| 2014/0131510 A1 | 5/2014 | Wang et al. | |
| 2014/0231582 A1 | 8/2014 | Headrick | |
| 2015/0060606 A1 | 3/2015 | Wang et al. | |
| 2015/0069174 A1 | 3/2015 | Wang et al. | |
| 2015/0232181 A1 | 8/2015 | Oakley et al. | |
| 2015/0259066 A1 | 9/2015 | Johannesson et al. | |
| 2016/0031558 A1 | 2/2016 | Wang et al. | |
| 2016/0075431 A1 | 3/2016 | Wang et al. | |
| 2016/0083084 A1 | 3/2016 | Wang et al. | |
| 2016/0159473 A1 | 6/2016 | Wang et al. | |

FOREIGN PATENT DOCUMENTS

| | | |
|---|---|---|
| CN | 101044416 A | 9/2007 |
| CN | 200730313931 | 10/2007 |
| CN | 201139948 Y | 10/2008 |
| CN | 300843633 | 10/2008 |
| CN | 101381002 A | 3/2009 |
| CN | 101382426 A | 3/2009 |
| CN | 101391651 A | 3/2009 |
| CN | 101445156 A | 6/2009 |
| CN | 200930127197 | 7/2009 |
| CN | 201321159 Y | 10/2009 |
| CN | 201367115 Y | 12/2009 |
| CN | 101667032 A | 3/2010 |
| CN | 301198089 | 5/2010 |
| CN | 301294391 | 7/2010 |
| CN | 301294392 | 7/2010 |
| CN | 201566831 U | 9/2010 |
| CN | 201604796 U | 10/2010 |
| CN | 301402085 | 12/2010 |
| CN | 101992854 A | 3/2011 |
| CN | 201800918 U | 4/2011 |
| CN | 102126554 A | 7/2011 |
| CN | 202071985 U | 12/2011 |
| CN | 202170017 U | 3/2012 |
| CN | 102424112 A | 4/2012 |
| CN | 202244078 U | 5/2012 |
| CN | 102490896 A | 6/2012 |
| CN | 102589537 A | 7/2012 |
| CN | 301977978 | 7/2012 |
| CN | 301994851 | 7/2012 |
| CN | 202358299 U | 8/2012 |
| CN | 102743880 A | 10/2012 |
| CN | 202464124 U | 10/2012 |
| CN | 201230425431 | 2/2013 |
| CN | 203047531 U | 7/2013 |
| CN | 203127141 U | 8/2013 |
| CN | 103350752 A | 10/2013 |
| DE | 202006013909 | 2/2007 |
| DE | 202006013909.5 U1 | 2/2007 |
| DE | 102007027326 A1 | 12/2008 |
| EP | 1901153 A1 | 3/2008 |
| EP | 2427374 A2 | 3/2012 |
| ES | 2354796 A1 | 3/2011 |
| FR | 2909972 A1 | 6/2008 |
| GB | 2455374 B | 11/2009 |
| JP | 2011046355 A | 3/2011 |
| KR | 30-0489037 | 4/2008 |
| TW | 201020172 A | 6/2010 |
| WO | 9530575 A1 | 11/1995 |
| WO | 2006037237 A1 | 4/2006 |
| WO | 2008033083 A2 | 3/2008 |
| WO | 2010137596 A1 | 12/2010 |
| WO | 2011149544 A1 | 12/2011 |

OTHER PUBLICATIONS

Billboard of Maker Space in Chengdu, Douban. (Evidence 37 of Request for Patent Right Invalidation Case No. 5W112895 for Chinese U.S. Pat. No. 201220686731.2).

The Specification of U.S. Appl. No. 61/709,269, filed Oct. 3, 2012, 5 pages.

Discussion entitled "What's the meaning of "A control" and "H control" in model airplane flight control'?", Zhihu.com., (Evidence 41 of Request for Patent Right Invalidation Case No. 5W112895 for Chinese Patent No. 201220686731.2).

European Search Report and Written Opinion, EP13795150.5, dated Feb. 6, 2015.

Helecopter-Borne Geophysical Survey Systems (Product Brochure), McPhar International.

International Searching Authority, "International Search Report and Written Opinion, PCT/CN2013/087053," Dated Feb. 27, 2014.

Jing Haicheng Nei Min Zheng Zi No. 05909 Notarial Certificate issued by Beijing Haicheng Notary Public Office, (Evidence 1 of Request for Patent Right Invalidation Case No. 5W112895 for Chinese Patent No. 201220686731.2).

Notice of Allowance dated Aug. 17, 2015 for U.S. Appl. No. 14/515,357.

Notice of Allowance dated Jan. 20, 2016 for U.S. Appl. No. 14/947,923.

Notice of Allowance dated Jan. 20, 2016 for U.S. Appl. No. 14/954,427.

Notice of Allowance dated Jul. 15, 2015, for U.S. Appl. No. 14/534,127.

Notice of Allowance dated Oct. 30, 2015, for U.S. Appl. No. 14/836,344.

Notice of Allowance dated Oct. 6, 2015 for U.S. Appl. No. 14/515,357.

Notice of Allowance dated Sep. 11, 2015 for U.S. Appl. No. 14/534,127.

Notice of Allowance dated Sep. 24, 2014 for U.S. Appl. No. 14/092,653.

Office Action dated Apr. 10, 2015 for U.S. Appl. No. 14/515,357.
Office action dated Apr. 3, 2014, for U.S. Appl. No. 14/092,653.
Office Action dated Apr. 9, 2015, for U.S. Appl. No. 14/534,127.
Office action dated Jun. 4, 2014, for U.S. Appl. No. 14/092,653.

(56) References Cited

OTHER PUBLICATIONS

Post entitled "Opening of 2012 Shanghai Model Exhibition" shows pictures of Shanghai Model Exhibition, (Evidence 4 of Request for Patent Right Invalidation Case No. 5W109794 for Chinese Patent No. 201220604396.7).
Question entitled 'Please recommend come communities or forums of UAV, domestic websites and oversea websites are both ok,' Zhihu.com., (Evidence 31 of Request for Patent Right Invalidation Case No. 5W112895 for Chinese Patent No. 201220686731.2).
Request for Patent Right Invalidation for Case No. 5W109794 of Chinese Patent No. 201220604396.7.
Request for Patent Right Invalidation for Case No. 5W112458 of Chinese Patent No. 201220604396.7.
Request for Patent Right Invalidation for Case No. 5W112895 of Chinese Patent No. 201220686731.2.
U.S. Appl. No. 14/534,127, filed Nov. 5, 2014, Wang et al.
U.S. Appl. No. 14/836,344, filed Aug. 26, 2015, Wang, et al.
U.S. Appl. No. 14/947,923, filed Nov. 20, 2015, Wang, et al.
U.S. Appl. No. 14/954,427, filed Nov. 30, 2015, Wang, et al.
Unmanned Aircraft Systems Geophysics, Mobile Geophysical Technologies. Http://www.mgt-geo.com/services/uas-geophysics.
Yuneec USA, Inc's "First Amended Answer and Defenses and Counterclaims to Plaintiffs First Amended Complaint," United States District Court—Central District of California. Case No. 5:16-cv-00595-Bro(KKx), dated Jan. 10, 2017.
Yuneec USA, Inc's, "Answer and Defenses to Plaintiffs First Amended Complaint and Counterclaims," United States District Court—Central District of California. Case No. 5:16-cv-00595-Bro(KKx), dated Dec. 20, 2016.
Discussion by Bartman, Welcome to multirotorforums.com!, Recreational SUAS Flyers Discussions, DroneVibes. (Evidence 23 of Request for Patent Right Invalidation Case No. 5W112895 for Chinese Patent No. 201220686731.2).
Discussion by MAPGPS, DIY of Common Model Airplane Controller AR.Drone, amoBBS. (Evidence 43 of Request for Patent Right Invalidation Case No. 5W112895 for Chinese Patent No. 201220686731.2).
Blog published by batfire, Tutorials-for-vl-v2-fc-systems but useful to all quadcopters, batfire's blog (Evidence 13 of Request for Patent Right Invalidation Case No. 5W112895 for Chinese Patent No. 201220686731.2).
Discussion by jeff2215, DJI Phantom Quadcopter, Multirotor Drone Talk (Evidence 15 of Request for Patent Right Invalidation Case No. 5W112895 for Chinese Patent No. 201220686731.2).
Discussion by Physics Dude, Magnetometer interference from current passing through wires, Multirotor Drone Talk (Evidence 17 of Request for Patent Right Invalidation Case No. 5W112895 for Chinese Patent No. 201220686731.2).
Discussion by Will Snodgrass, Tumigy HAL Frame, DIY Drones(Evidence 17 of Request for Patent Right Invalidation Case No. 5W112895 for Chinese Patent No. 201220686731.2).
Aerial Photography Master, Test of a DJI's Aerial Photography Aerial Vehicle. (Evidence 15 of Request for Patent Right Invalidation Case No. 5W112458 for Chinese Patent No. 201220604396.7).
Blog by ColorPaper, Experience exchange on MWC four-axis flight control and modulation, SlimApp's Blog, csdn.net. (Evidence 45 of Request for Patent Right Invalidation Case No. 5W112895 for Chinese Patent No. 201220686731.2).
Blog by cy-PCB, Some websites regarding electronic technical filed at home and abroad, Caozhaokun's Special Column, 52rd Blog. (Evidence 44 of Request for Patent Right Invalidation Case No. 5W112895 for Chinese Patent No. 201220686731.2).
Discussion by R-Lefebvre, Overlapping Propeller Designs, Recreational sUAS Flyers (Evidence 12 of Request for Patent Right Invalidation Case No. 5W112895 for Chinese Patent No. 201220686731.2).
Discussion by Rob Lefebvre, New Octo Copter Design/Build Thread, DIY Drones (Evidence 21 of Request for Patent Right Invalidation Case No. 5W112895 for Chinese Patent No. 201220686731.2).

Rathlev, et al., Innovative Technologies for Aerial Survey of Gas Pipes, Gas for Energy, Issue Jan. 2012, 5 pages, 2012.
Post entitled "Pictures in Shanghai International Model Exhibition!!Multi-rotor devices!!," 5iMX.com. (Evidence 3 and Evidence 6 of Request for Patent Right Invalidation Case No. 5W109794 for Chinese Patent No. 201220604396.7).
Post entitled "Pictures of Multi-rotor Devices in Shanghai International Model Exhibition." (Evidence 2 and Evidence 5 of Request for Patent Right Invalidation Case No. 5W109794 for Chinese Patent No. 201220604396.7).
State Intellectual Property Office of the P.R.C (SIPO) Copy of Chinese Patent for Application 201210423957.8, filed on Oct. 29, 2012., 2012.
The 11th Beijing International Model Exposition, News show pictures of models exhibited by Skyratec Co., Ltd. (Evidence 1 of Request for Patent Right Invalidation Case No. 5W112458 for Chinese Patent No. 201220604396.7).
The 9th Shanghai International Model Exhibition, News show pictures of Shenzhen Skyartec takes part in the exhibition, Skyartec. (Evidence 4 and Evidence 5 of Request for Patent Right Invalidation Case No. 5W109794 for Chinese Patent No. 201220604396.7).
Video uploaded by China remote control model network, Parrot AR.Drone war gestern, Youku. (Evidence 8 of Request for Patent Right Invalidation Case No. 5W112458 for Chinese Patent No. 201220604396.7).
Video uploaded by freexquad, 11th Beijing International Model Exhibition in 2012, Youku. (Evidence 2 of Request for Patent Right Invalidation Case No. 5W112458 for Chinese Patent No. 201220604396.7).
Video uploaded by freexquad, Shanghai model show, Youku. (Evidence 7 of Request for Patent Right Invalidation Case No. 5W112458 for Chinese Patent No. 201220604396.7).
Blog by Shenda BSK UAV Group, Grand release of course and documents for supercool Mwc four-axis air vehicle DIY, blog.sina.com. (Evidence 46 of Request for Patent Right Invalidation Case No. 5W112895 for Chinese Patent No. 201220686731.2).
Discussion by mz13765222013, WKM crashing, please analyze the reasons, DJI, 5iMX.com. (Evidence 30 of Request for Patent Right Invalidation Case No. 5W112895 for Chinese Patent No. 201220686731.2).
Discussion by Wenjian, Sad Plane Explosion, the Master, Please Give Some Reason, 5iMX.com. (Evidence 28 of Request for Patent Right Invalidation Case No. 5W112895 for Chinese Patent No. 201220686731.2).
Recommendation post published by kinglytt, Some collected excellent model airplane websites, GuoKr Group, Oct. 15, 2013. (Evidence 42 of Request for Patent Right Invalidation Case No. 5W112895 for Chinese Patent No. 201220686731.2).
A Live Unmanned Aerial Vehicle Streaming Media Bbs, AiChengZu.com. (Evidence 26 of Request for Patent Right Invalidation Case No. 5W112895 for Chinese Patent No. 201220686731.2).
Post by crazyboyyy, Big Time four-axis, Nankai RC Model Club of Tianjin, 5iMX.com. (Evidence 29 of Request for Patent Right Invalidation Case No. 5W112895 for Chinese Patent No. 201220686731.2).
Blog published by kobbee9, the Difference between the Accelerometer and the Gyroscope, N's Blog, csdn.net. (Evidence 35 of Request for Patent Right Invalidation Case No. 5W112895 for Chinese Patent No. 201220686731.2).
Discussion by armok, Do Not Always Think that Shu-Meinism using the TF Card is not reliable, amoBBS. (Evidence 33 of Request for Patent Right Invalidation Case No. 5W112895 for Chinese Patent No. 201220686731.2).
Welcome MultiRotorForum Members to DroneVibes, DroneVibes News (Evidence 22 of Request for Patent Right Invalidation Case No. 5W112895 for Chinese Patent No. 201220686731.2).
(2017) Jing Haicheng Nei Min Zheng Zi No. 05906 Notarial Certificate issued by Beijing Haicheng Notary Public Office. (Evidence 18 of Request for Patent Right Invalidation Case No. 5W112895 for Chinese Patent No. 201220686731.2).
(2017) Jing Haicheng Nei Min Zheng Zi No. 05907 Notarial Certificate issued by Beijing Haicheng Notary Public Office. (Evi-

(56) References Cited

OTHER PUBLICATIONS dence 19 of Request for Patent Right Invalidation Case No. 5W112895 for Chinese Patent No. 201220686731.2).

(2017) Jing Haicheng Nei Min Zheng Zi No. 05908 Notarial Certificate issued by Beijing Haicheng Notary Public Office. (Evidence 20 of Request for Patent Right Invalidation Case No. 5W112895 for Chinese Patent No. 201220686731.2).

Appendix A (List of References) of Autel Final Invalidity Contentions, Dec. 1, 2017, SZ DJI Technology, Co., Ltd., and DJI Europe B.V. v. Autel Robotics USA LLC, and Autel Aerial Technology, Co., Ltd., Civ. No. 16-706-LPS-CJB (D. Del.).

Catalog of Recent Posts published on DroneVibes as of Jun. 23, 2017. (Evidence 24 of Request for Patent Right Invalidation Case No. 5W112895 for Chinese U.S. Pat. No. 201220686731.2).

Aping, Five Notes Before Purchasing an Unmanned Aerial Vehicle (II), Yu Chen Aerospace, Oct. 20, 2015. (Evidence 25 of Request for Patent Right Invalidation Case No. 5W112895 for Chinese Patent No. 201220686731.2).

Aykelinchayev, "AeroQuad: Your Friendly Neighborhood Quadcopter Platform, A build Tutorial," 2010.

Barczyk, et al., An Experimental Validation of Magnetometer Integration into a GPS-Aided Helicopter UAV Navigation System, 2010 American Control Conference, IEEE, 2010.

Barczyk, et al., Invariant Extended Kalman Filter Design for a Magnetometer-plus-GPS Aided Inertial Navigation System, 2011, 50th IEEE Conference on Decision and Control and European Control Conference, IEEE, 2011.

Barczyk, et al., Integration of a Triaxial Magnetometer into a Helicopter UAV GPS-Aided INS, IEEE Transactions on Aerospace and Electronic Systems, vol. 48, No. 4., 2012.

Barrett, Hybrid Aircraft Aerodynamics and Aerodynamic Design Considerations of Hover-to-Dash Convertible UAVs, Advanced UAV Aerodynamics, Flight Stability and Control: Novel Concepts, Theory and Applications, 2017.

Cao, et al., EMI Suppression of UAV Power in Aeromagnetic Survey, 2013 IEEE Electromagnetic Compatibility Magazine, vol. 2., 2013.

Cong, Welcome Chinese-style Cheap Copy, Everyone Can be a Maker, TMTPost. (Evidence 36 of Request for Patent Right Invalidation Case No. 5W112895 for Chinese Patent No. 201220686731.2).

Eck, et al., Mission Planning and Flight Precision Analysis for Autonomous Aerial Magnetic Scanning, American Institute of Aeronautics and Astronautics, 2011.

Euston, et al., a Complementary Filter for Attitude Estimation of a Fixed-Wing UAV, Intelligent Robots and Systems, 2008, IEEE/RSJ International Conference on IEEE, 2008.

Forrester, et al., Magnetic Signature Control Strategies for an Unmanned Aircraft System, (2011).

Fukuyama., The end of mystery: Why we all need a drone of our own, Financial Time Chinese. (Evidence 40 of Request for Patent Right Invalidation Case No. 5W112895 for Chinese Patent No. 201220686731.2).

Hammerseth., Autonomous Unmanned Aerial Vehicle in Search and Rescue, Master's Thesis, Norwegian University of Science and Technology, (2013).

Harsanyi., "A Y6 Build Log, Blog published on DIY Drones," (Evidence 16 of Request for Patent Right Invalidation Case No. 5W112895 for Chinese Patent No. 201220686731.2).

Huang., et al., Principle and Implementation of an Autonomous Flight Robot System Based on Visual Navigation, China Aerial Robot Competition Papers (Evidence 9 of Request for Patent Right Invalidation Case No. 5W112895 for Chinese Patent No. 201220686731.2).

Kilby., et al., Make: Getting Started with Drones: Build and Customize Your Own Quadcopter, China Machine Press. (Evidence 32 of Request for Patent Right Invalidation Case No. 5W112895 for Chinese Patent No. 201220686731.2).

Li., Distinctive Creator, Chris Anderson, Southern People Weekly. (Evidence 39 of Request for Patent Right Invalidation Case No. 5W112895 for Chinese Patent No. 201220686731.2).

Liu., et al., Magnetometer Calibration Scheme for Quadrotors with On-Board Magnetic Field of Multiple DC Motors, Proceedings of 2013 Chinese Intelligent Automation Conference, (2013).

Malgoza., et al., A picture of "The Final board," Wuad-Copter. http://www.eecs.ucf.edu/seniordesign/su2010fa2010/g03/photos.html., (2010).

McKay., et al., Development of Autonomous Magnetometer Rotorcraft for Wide Area Assessment, Idaho National Laboratory, (2011).

Meister., et al., Development of a GPS/INS/MAG Navigation System and Waypoint Navigator for a VTOL UAV, Unmanned Systems Technology IX, vol. 6561, 65611D, (2007).

Metni., Sensor Fusion for Attitude and Bias Estimation fora VTOL UAV, Proceedings of the ASME 2010, 10th Biennial Conference on Engineering Systems Design and Analysis, (2010).

Mohr., et al., A Micro Air Vehicle Navigation System, Position, Location, and Navigation Symposium, 2006 IEEE, (2006).

Mohr., et al., Micro Air Vehicle Navigation System, IEEE A&E Systems Magazine, (2008).

Perry., et al., Rapid Area Coverage for Unexploded Ordnance using UAVs Incorporating Magnetic Sensors, Battlespace Digitalization and Network-Centric Warfare II, vol. 4741, (2002).

Saraceno, Aerial Videography for Beginners, Part 2, LACPUG. (Evidence 9 of Request for Patent Right Invalidation Case No. 5W112458 for Chinese Patent No. 201220604396.7).

Simpson., How Britain Beat Germany's Magnetic Sea Mines, War is Boring, Nov. 23, 2014. https://medium.com/war-is-boring/how-britain-beat-germanys-wwii-magnetic-sea-mines-bfec5558704c.(2014).

Stanley., Magnetometer Placement—Where and Why, NXP Me & My Smarter World, Oct. 3, 2012. https://blog.nxp.com/sensors/magnetometer-placement-where-and-why, 2012.

Stepaniak, "A Quadrotor Sensor Platform, A dissertation Presented to the Faculty of the Russ College of Engineering and Technology of Ohio University," Nov. 2008.

Stoll, Unmanned Aircraft Systems for Rapid Near Surface Geophysical Measurements, International Archives of the Photogrammetry, Remote Sensing and Spatial Information Sciences, vol. XL 1/W2, Sep. 2013.

Tanwani, et al., Experimental Network Embedded Mini Drone—Part II. Distributed FDI, Procedings of the European Control Conference, 2007, IEEE, Jul. 2007.

Trammell III, et al., "Using Unmanned Aerial Vehicle-Borne Magnetic Sensor to Detect and Locate Improvised Explosive Devices and Unexploded Ordnance, Sensors and C3I Technologies for Homeland Security and Homeland Defense IV," vol. 5778, 2005.

Versteeg, et al., "Feasibility Study for an Autonomous UAV Magnetometer System" Idaho National Laboratory, Sep. 2007.

Wang, "Communication to the Editor in Chief, Anderson Creating 3D Robotics Remote Control Air Vehicle, Tencent Tech," (Evidence 38 of Request for Patent Right Invalidation Case No. 5W112895 for Chinese Patent No. 201220686731.2).

Wang, Opening of the Ninth Shanghai International Model Exhibition. (Evidence 1 and Evidence 3 of Request for Patent Right Invalidation Case No. 5W109794 for Chinese Patent No. 201220604396.7).

Wells, "Attenuating Magnetic Interference in a UAV System," (2008).

Wendel, et al., "MAV Attitude Estimation Using Los-Cost MEMS Inertial Sensors and GPS," ION 61st Annual Meeting, (2005).

Wendel, et al., "An Integrated GPS/MEMS-IMU Navigation System for an Autonomous Helicopter, ScienceDirect," Aerospace Science and Technology, (2006).

Wenger, et al., "System Concepts and Performance Analysis of Multi-Sensor Navigation Systems for UAV Applications," American Institute of Aeronautics and Astronautics, (2003).

Xiang, "Pirate Flight Control," Sogou Baike. (Evidence 47 of Request for Patent Right Invalidation Case No. 5W112895 for Chinese Patent No. 201220686731.2).

Zhang, "DIY Handbook of Unmanned Aerial Vehicle," Baidu.com. (Evidence 27 of Request for Patent Right Invalidation Case No. 5W112895 for Chinese Patent No. 201220686731.2).

(56) References Cited

OTHER PUBLICATIONS

Zuo, et al., "Multi-Sensor Fusion Method using MARG for a fixed-wing Unmaned Aerial Vehicle," Proceedings of 2012 IEEE International Conference on Mechatronics and Automation, (2012).
Defendant's Autel Robotics USA LLC and Autel Aerial Technology Co., Ltd,s Final Invalidity Contentions, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.)., 47 pages.
Invalidity Claim Chart, Exhibit A-1, U.S. Pat. No. 9,016,617: US 2012/0083945, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-2, U.S. Pat. No. 9,016,617: US 2011/0301784, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-3, U.S. Pat. No. 9,016,617: US 2008/0125920, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-4, U.S. Pat. No. 9,016,617: US 2014/0231582, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-5, U.S. Pat. No. 9,016,617: WO 2008/033083, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-6, U.S. Pat. No. 9,016,617: U.S. Pat. No. 3,123,766, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-7, U.S. Pat. No. 9,016,617: US 2014/0008496, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-8, U.S. Pat. No. 9,016,617: U.S. Pat. No. 3,663,953, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-9, U.S. Pat. No. 9,0116,617: WO 2008/033083, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit A-10, U.S. Pat. No. 9,016,617: Microdrones md4-1000, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-1, U.S. Pat. No. 9,284,049: 2014/0231582, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-2, U.S. Pat. No. 9,284,049: 2012/0083945, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-3, U.S. Pat. No. 9,284,049: 2011/0301784, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-4, U.S. Pat. No. 9,284,049: WO 2011/149544, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-5, U.S. Pat. No. 9,284,049: US 2009/0134273, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-6, U.S. Pat. No. 9,284,049: US 2008/0125920, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit B-7, U.S. Pat. No. 9,284,049: Microdrones md4-1000, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-1, U.S. Pat. No. 9,321,530: US 2012/0083945, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-2, U.S. Pat. No. 9,321,530: US 2012/0043411, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-3, U.S. Pat. No. 9,321,530: US 2011/0301784, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-4, U.S. Pat. No. 9,321,530: US 2008/0125920, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-5, U.S. Pat. No. 9,321,530: DE 102007027326, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-6, U.S. Pat. No. 9,321,530: US 2014/0231582, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-7, U.S. Pat. No. 9,321,530: U.S. Pat. No. 3,123,766, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-8, U.S. Pat. No. 9,321,530: US 2014/0008496, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-9, U.S. Pat. No. 9,321,530: U.S. Pat. No. 3,663,953, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-10, U.S. Pat. No. 9,321,530: WO 2008/033083, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit C-11, U.S. Pat. No. 9,321,530: Microdrones md4-1000, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Invalidity Claim Chart, Exhibit D, Design U.S. Pat. No. D691,514, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Attachment A, microdrones Image, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 1 pages.
Attachment B, microdrones Image, "md4-1000: Robust and Powerful," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 5 pages.
Attachment C, microdrones Diagram, :"800-4-01-I," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 1 page.
Attachment D, microdrones Information Packet, "microdrone performance md4-1000," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).

(56) References Cited

OTHER PUBLICATIONS

Attachment E, microdrones Information Packet, "Top Level Performance: Advanced AUV Technology," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.).
Attachment F, "microdrones Media Documents," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 5 pages.
Attachmenb G, "UAV Insider, the Latest in Unmanned Aircraft for Civil Industry," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 4 pages.
Attachment H, "More Than 1000 Businesses and Professional Users Worldwide Trust microdrones," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 1 pages.
Attachment I, "Integration. Aviation. Innovation. (And Friendship.): The Story of microdrones," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 8 pages.
Attachment J, "Product Profile—microdrones md4-1000—microdrones Asia," Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 3 pages.
Attachment K, "md4-1000, from microdrones," Specification Sheet, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 4 pages.
Attachment L, "md4-1000, 800-4-06-E," microdrones Diagram, Dec. 1, 2017, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), 1 page.
Batfire's Comment at the RC Group Forum, (1) Posted Jun. 12, 2012, last edited Apr. 24, 2014; (1) Posted Jun. 28, 2012, last edited Nov. 2, 2012. www.rcgroups.com/forums/showthread.php?1774685-DJI-Phantom-Quadcopter/page7.
Helios 400, published Nov. 15, 2011. www.youtube.com/watch?v=cp2qiSV8Gs8.
Jeff2215's Comment at RC Group, published Nov. 30, 2012, last edited Nov. 30, 2012. https://www.rcgroups.com/forums/showthread.php?1774685-DJI-Phantom-Quadcopter/page7.
R_Lefebvre's Comments at Drone Vibes Forum, "12. R Lefebvre Overlapping Propeller Designs," Posted Sep. 12, 2012. https://www.dronevibes.com/forums/threads/overlapping-propeller-designs.
Signal15's answer to Physic_Dude's question at RC Group Forum, Sensor Further away from Inner Shell but not at landing stand. www.rcgroups.com/forums/showthread.php?1685228-Magnetometer-interference-from-current-passing-through-wires.
Skyartec Model A, www.youtube.com/watch?v=F2IQQg6a5r4, May 5, 2012.
Skyartec Model B, www.youtube.com/watch?v=MCkFpversMo, Aug. 30, 2012.
Steven Harsanyi's Post at His Blog at DIY Drones Forum, Posted Oct. 29, 2011, https://diydrones.com/profiles/blogs/a-y6-build-log.
Will Snodgrass's Comment at the DIY Drones Forum, Posted Nov. 11, 2012, https://diydrones.com/forum/topics/turnigy-hal-frame-1.
Zoujinkexue Documentary, May 24, 2011, http://tv.people.com.cn/GB/166419/14727557.html.
"Principle and Implementation of an Automated Unmanned Aircraft System Based on Visual Navigation," 2004.
"Overlapping Propeller Designs," Started Sep. 12, 2012. https://www.dronevibes.com/forums/threads/overlapping-propeller-designs.7653/.
"Tutorial for v1&v2 fc systems but useful to all quadcopters," https://www.rcgroups.com/forums/showthread.php?1670862-Tutorial-for-v1-v2-fc-systems-but-useful-to-all-quadcopters.
"Magnetometer interference from current passing through wires," https://www.rcgroups.com/forums/showthread.php?1685228-Magnetometer-interference-from-current-passing-through-wires.
"Turnigy HAL Frame," https://diydrones.com/forum/topics/turnigy-hal-frame-1.
"Quad-Copter Group 3," http://www.eecs.ucf.edu/seniordesign/su2010fa2010/g03/Docs.html.
Notification of Acceptance of Request for Invalidation, *Shenzhen Autel Robotics Intelligent Aerial Technologies, Co., Ltd.*, v. *Shenzhen DJI Technology Co., Ltd.*, Case No. 5W112458, Patent Reexamination Board, State Intellectual Property Office of The Peoples Republic of China, Jun. 6, 2017., 93 pages. (incl. translation).
Notification of Oral Proceedings for Request for Invalidation, *Shenzhen Autel Robotics Intelligent Aerial Technologies, Co., Ltd.*, v. *Shenzhen DJI Technology Co., Ltd.*, Case No. 5W112458, Patent Reexamination Board, State Intellectual Property Office of the Peoples Republic of China, Jul. 5, 2017., 12 pages. (incl. translation).
Decision for the Request for Invalidation, *Shenzhen Autel Robotics Intelligent Aerial Technologies, Co., Ltd.*, v. *Shenzhen DJI Technology Co., Ltd.*, Case No. 5W112458, Patent Reexamination Board, State Intellectual Property Office of The Peoples Republic of China, Feb. 5, 2018., 39 pages. (incl. translation).
Notice of Acceptance of Request for Invalidation, *Shenzhen Autel Robotics Intelligent Aerial Technologies, Co., Ltd.*, v. *Shenzhen DJI Technology Co., Ltd.*, Case No. 5W112913, Patent Reexamination Board, State Intellectual Property Office of The Peoples Republic of China, Jul. 13, 2017., 29 pages (incl. translation).
Notice of Oral Hearing for Request for Invalidation, *Shenzhen Autel Robotics Intelligent Aerial Technologies, Co., Ltd.*, v. *Shenzhen DJI Technology Co., Ltd.*, Case No. 5W112913, Patent Reexamination Board, State Intellectual Property Office of The Peoples Republic of China, Aug. 15, 2017., 13 pages (incl. translation).
Examination Decision of Request for Invalidation, *Shenzhen Autel Robotics Intelligent Aerial Technologies, Co., Ltd.*, v. *Shenzhen DJI Technology Co., Ltd.*, Case No. 5W112913, Patent Reexamination Board, State Intellectual Property Office of The Peoples Republic of China, Feb. 5, 2018., 19 pages. (incl. translation).
Request for Invalidation, *SZ Autel Intelligent Aerial Technology Co., Ltd.*, v. *Shenzhen DJI Technology Co., Ltd.*, Case No. 5W112895, Patent Reexamination Board, State Intellectual Property Office of the Peoples Republic of China, Aug. 30, 2016., 131 pages (incl. translation).
Notification of Oral Hearing for Request for Invalidation, *SZ Autel Intelligent Aerial Technology Co., Ltd.*, v. *Shenzhen DJI Technology Co., Ltd.*, Case No. 5W112895, Patent Reexamination Board, State Intellectual Property Office of the Peoples Republic of China, Aug. 28, 2017., 2 pages (incl. translation).
Notification of Oral Hearing for Request for Invalidation, *SZ Autel Intelligent Aerial Technology Co., Ltd.*, v. *Shenzhen DJI Technology Co., Ltd.*, Case No. 5W112895, Patent Reexamination Board, State Intellectual Property Office of the Peoples Republic of China, Feb. 1, 2018., 2 pages (incl. translation).
Invalidation Decision, *SZ Autel Intelligent Aerial Technology Co., Ltd.*, v. *Shenzhen DJI Technology Co., Ltd.*, Case No. 5W112895, Patent Reexamination Board, State Intellectual Property Office of the Peoples Republic of China, Apr. 4, 2018., 40 pages (incl. translation).
Defendants' List of Claim Terms in Need of Construction, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), May 26, 2017., 3 pages.
Defendants' Proposed Constructions of Claims, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), Jun. 9, 2017., 5 pages.
Joint Stipulation Regarding Claim Construction, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), Jul. 5, 2017., 2 pages.
Plaintiffs Disclosure of Proposed Claim Constructions, *SZ DJI Technology, Co., Ltd.*, and *DJI Europe B.V.v. Autel Robotics USA*

(56) References Cited

OTHER PUBLICATIONS

LLC, and *Autel Aerial Technology, Co., Ltd.*, Civ. No. 16-706-LPS-CJB (D. Del.), Jun. 9, 2017., 3 pages.
Plaintiffs Disclosure of Proposed Terms for Construction, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.), May 26, 2017., 3 pages.
Expert Report of Professor Ron Barrett, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.)., Dec. 22, 2017., 462 pages.
Expert Reply Report of Professor Ron Barrett, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.)., Feb. 16, 2018., 169 pages.
Supplemental Expert Report of Professor Ron Barrett Regarding Invalidity, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.)., 75 pages.
Rebuttal Report of Dr. J. A. Janet in Response to Expert Report of Professor Barrett Regarding Invalidity, *SZ DJI Technology, Co., Ltd.*, and *DJI Europe B.V.v. Autel Robotics USA LLC*, and *Autel Aerial Technology, Co., Ltd.*, Civ. No. 16-706-LPS-CJB (D. Del.)., Jan. 19, 2018., 271 pages.
Savov, "Xiaomi unveils the Mi Drone, costing $460 for 4K video or $380 for 1080p" May 25, 2016. https://www.theverge.com/circuitbreaker/2016/5/25/11767134/xiaomi-mi-drone-release-date-price-specs-features.
Wikipedia "GoPro," last edited Oct. 11, 2018. https://en.wikipedia.org/w/index.php?title=GoPro&oldid=863470456.
Yuneec "About Us" http://us.yuneec.com/about-us.
youtube video—Yuneec Q500—Keep Compass and Antenna dry (English), Jan. 23, 2015. https://www.youtube.com/watch?v=PxILwVgjVnk.
youtube video—GoPro Karma Disassembly, May 9, 2017. https://www.youtube.com/watch?v=oxCXe6itq1Q.
youtube video—3DR Solo Teardown, Jul. 25, 2015. https://www.youtube.com/watch?v=qczQUKSmLVO.
youtube video—3DR Solo Drone Disassembly Step by Step, Oct. 24, 2015. https://www.youtube.com/watch?v=5jzKOa2lz-g.
Xiaomi "Xiaomi Mi Drone 4K User Manual Guide," Jun. 1, 2017., http://www.xiaomi4k.com/xiaomi-mi-drone-4k-user-manual/.
Wikipedia "3D Robotics" last edited on Aug. 17, 2018., https://en.wikipedia.org/wiki/3D_Robotics.
Exhibit A, List of Materials Considered, Rebuttal Expert Report of J. Janet *SZ DJI Technology Co., et al., v. Autel Robotics USA LLC, et al.*, C.A. No. 16-706-LPS (D. Del.). Jan. 19, 2018.
Exhibit D1, Responsive Claim Chart, U.S. Pat. No. 9,016,617: Microdrones md4-1000, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit D2, Responsive Claim Chart, U.S. Pat. No. 9,016,617: US20140231582, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit D3, Responsive Claim Chart, U.S. Pat. No. 9,016,617: US20120083945, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit E1, Responsive Claim Chart, U.S. Pat. No. 9,284,049: Microdrones md4-1000, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit E2, Responsive Claim Chart, U.S. Pat. No. 9,284,049: US20140231582, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit E3, Responsive Claim Chart, U.S. Pat. No. 9,284,049: US20120083945, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit F1, Responsive Claim Chart, U.S. Pat. No. 9,321,530: Microdrones md4-1000, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit F2, Responsive Claim Chart, U.S. Pat. No. 9,321,530: US20140231582, Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit F3, Responsive Claim Chart, U.S. Pat. No. 9,321,530: US20120083945 Rebuttal Report of J. A. Janet, *SZ DJI Technology Co., et al., v. Autel Robotics USA LLC, et al.*, C.A. No. 16-706-LPS (D. Del.). Jan. 19, 2018.
Exhibit A, Dr. Barrett Curriculum Vitae, Expert Reply Report of R. Barrett, *SZ DJI Technology Co., et al., v. Autel Robotics USA LLC, et al.*, C.A. No. 16-706-LPS (D. Del.). Feb. 16, 2018.
Exhibit B, Dr. List of Barrett Patents, Expert Reply Report of R. Barrett, *SZ DJI Technology Co., et al., v. Autel Robotics USA LLC, et al.*, C.A. No. 16-706-LPS (D. Del.). Feb. 16, 2018.
Exhibit C, List of Materials Considered, Expert Reply Report of R. Barrett, *SZ DJI Technology Co., et al., v. Autel Robotics USA LLC, et al.*, C.A. No. 16-706-LPS (D. Del.). Feb. 16, 2018.
Exhibit D, Invalidity Claim Chart, U.S. Pat. Pub 20140231582/U.S. Appl. No. 61/709,269, Expert Reply Report of R. Barrett, *SZ DJI Technology Co., et al., v. Autel Robotics USA LLC, et al.*, C.A. No. 16-706-LPS (D. Del.). Feb. 16, 2018.
Dvids—Video—SOFWERX hosts ThunderDrone RPE II. https://www.dvidshub.net/video/583565/sofwerx-hosts-thunderdrone-rpe-ii Jan. 31, 2018.
Headrick, youtube video—HUGO—Flight Test Footage, Oct. 26, 2012., https://www.youtube.com/watch?v=SQHTUEwPApM.
Headrick, youtube video—HUGO—Thin Shell Multi Rotor Airframe, Oct. 27, 2012., https://www.youtube.com/watch?v=SpseGxi3A40.
Headrick, youtube video—HUGO—Late Night Test Flight, Oct. 31, 2012., https://www.youtube.com/watch?v=g76icE1xm3A.
Headrick, youtube video—HUGO—Flying Around at Bayfront Park, Dec. 28, 2012., https://www.youtube.com/watch?v=Az6EzC72dhM.
Headrick, youtube video—HUGO—with APM 2.5, Jan. 24, 2013., https://www.youtube.com/watch?v=EYu3VIMmqgg.
Headrick, youtube video—HUGO—Multi Rotor from AeroTestra, Nov. 17, 2013., https://www.youtube.com/watch?v=571HTNHzPHE.
youku video—Shanhai Model Show, Sep. 1, 2012., http://v.youku.com/v_show/id_XNDQ1NjkwNjY0.html?spm=a2hzp.8253869.0.0&from=y1.7-2.
Exhibit A, Dr. Barrett Curriculum Vitae, Supplemental Expert Report of R. Barrett *SZ DJI Technology Co., et al., v. Autel Robotics USA LLC, et al.*, C.A. No. 16-706-LPS (D. Del.)., Feb. 28, 2018.
Exhibit B, Dr. Barrett Patents, Supplemental Expert Report of R. Barrett *SZ DJI Technology Co., et al., v. Autel Robotics USA LLC, et al.*, C.A. No. 16-706-LPS (D. Del.)., Feb. 28, 2018.
Exhibit C, List of Materials Considered, Supplemental Expert Report of R. Barrett *SZ DJI Technology Co., et al., v. Autel Robotics USA LLC, et al.*, C.A. No. 16-706-LPS (D. Del.)., Feb. 28, 2018.
Barrett, youtube video—XQ-138 Hypermaneuverable UAV—Weapon Firing, Nov. 30, 2009. https://www.youtube.com/watch?v=1CCbo_hWS-U.
Barrett, youtube video—XQ-138 Hypermaneuverable UAV—Basic Flying Nov. 30, 2009. https://www.youtube.com/watch?v=PbUX00XJqtE.
Barrett, youtube video—XQ-138 Hypermaneuverable UAV—Eglin AFB Flying Nov. 30, 2009. https://www.youtube.com/watch?v=k2mFhrjfoFQ.
Barrett, youtube video—XQ-138 Hypermaneuverable UAV—Redstone Arsenal Flying, Nov. 30, 2009. https://www.youtube.com/watch?v=64481IxJ3pE.
Barrett, youtube video—XQ-138 Hypermaneuverable UAV—Precision Autorecovery, Nov. 30, 2009. https://www.youtube.com/watch?v=HZ1xWhq1hRU.

(56) References Cited

OTHER PUBLICATIONS

Barrett, et al., "XQ-138 Convertible Aerial Vehicle Design Report," Jun. 2002.
Lillas post at DIY Drones, "Copter slowly yaws without user input and with compass installed," Oct. 25, 2012. http://diydrones.com/forum/topics/copter-slowly-yaws-without-user-input-and-with-compass-installed.
Headrick, Youtube Video—HUGO—With Prop Guards, Jul. 7, 2013. https://www.youtube.com/watch?v=J2850A5w6vc.
Headrick, Youtube Video—HUGO—Visualizer for SketchUp, May 15, 2014. https://www.youtube.com/watch?v=6vV1Umt0bw.
DJI Phantom Quick Start Manual Version 1.7 (English), Revised Sep. 25, 2013. http://dl.djicdn.com/downloads/phantom/en/PHANTOM_Quick_Start_Manual_v1.7_en.pdf.
Freexquad, Youku Channel, http://i.youku.com/i/UMzUyNzMyODAw/videos?order=1&page=7&last_item=&last_pn=1&last_vid=214429616&spm=a2hzp.8253869.0.0.
DrDrone.ca, "Phantom 3—Landing Gear (Part 29)", https://www.drdrone.ca/products/phantom-3-part-29-landing-gear.
European Space Agency, youtube video, "Lithospheric Magnetic field," Mar. 21, 2017. https://www.youtube.com/watch?time_continue=85&v=58FZ6OCI6mk.
Skyartec, youtube video "Skyartec Butterfly," Sep. 17, 2012. https://www.youtube.com/watch?v=OLNad8mJek8.
Theareator, "Helios 400," Nov. 20, 2011. https://www.youtube.com/watch?v=sicj7kdZ8gA.
Live Dabei, "Helios 400 Mit Kameragestell GoPro Hero 2 HD," Mar. 11, 2012. https://www.youtube.com/watch?v=O0uBDmp9FRY.
Theareator, "Helios 400 Langsam Geflogen.avi," Oct. 9, 2011. https://www.youtube.com/watch?v=8YuKwoO7KQ8.
Kleinklausfpv, "Helios 400," Jun. 20, 2012. https://www.youtube.com/watch?v=tBmU6LIO5p8.
Quadcopters UK, "DJI Phantom Quadcopter Demo," Nov. 21, 2012. hhttps://www.youtube.com/watch?v=uE8U8XhHX6M.
DJI, "DJI Phantom—The Spirit of Flight," Nov. 29, 2012. https//www.youtube.com/watch?v=e1ZbJFme7VY.
Quadcopters UK, "DJI Phantom Quadcopter First Test Flight," Nov. 23, 2012 https//www.youtube.com/watch?v=UUFewc6KXf4.
Flying-Hobby, "DJI Phantom QuadCopter," Nov. 23, 2012. https//www.youtube.com/watch?v=A9Iq8pnFzdw.
Image Capture Bates No. RUSA0378554 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378555 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378564 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378565 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378566 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378567 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378568 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378569 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378570 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Image Capture Bates No. RUSA0378571 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.
Malgoza, et al., "Project Description and Block Diagram Surveillance Quad-Copter," Summer 2010. Bates Nos. RUSA0378646-RUSA0378648 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 3 pages.
Malgoza, et al., "Quad-Copter—Autonomous Surveillance Robot, EEL 4914 Senior Design Documentation," Summer—Fall 2010. Bates Nos. RUSA0378897-RUSA0378897 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 145 pageS.
Malgoza, et al., "Quad-Copter—Autonomous Surveillance Robot, EEL 4914 Senior Design Documentation," Summer—Fall 2010. Bates Nos. RUSA0378657-RUSA0378813 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 157 pages.
Malgoza, et al., "Quad-Copter, Group 3" Fall 2010 Bates Nos. RUSA0378814-RUSA0378896 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 83 pages.
Malgoza, et al., "Quad-Copter, Group 3," Fall 2010. Bates Nos. RUSA0378572-RUSA0378645 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 74 pages.
Malgoza, et al., "Quad-Copter," School of Electrical Engineering and Computer Science, University of Central Florida, Orlando, Florida. Bates Nos. RUSA0378556-RUSA0378563 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 8 pages.
Malgoza, et al., "Quad-Copter: Home," Summer—Fall 2010. Bates Nos. RUSA0378650-RUSA0378651 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 2 pages.
Malgoza, et al., "Quad-Copter: Photos," Summer—Fall 2010. Bates Nos. RUSA0378652-RUSA0378656 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 74 pages.
Malgoza, et al., "Quad-Copter: Documentation," Summer—Fall 2010. Bates No. RUSA0378649 Materials Relied Upon Expert Reply Report of R. Barrett *SZ DJI Technology Co., et al.*, v. *Autel Robotics USA LLC, et al.*, C.A. No. 16-706-LPS (D. Del.)., Feb. 16, 2018., 1 page.

\* cited by examiner

UNMANNED AERIAL VEHICLE AND OPERATIONS THEREOF

CROSS-REFERENCE

This application is a continuation of U.S. patent application Ser. No. 15/175,473, filed Jun. 7, 2016, which is a continuation of U.S. patent application Ser. No. 15/012,006, filed Feb. 1, 2016, now U.S. Pat. No. 9,394,048, issued Jul. 19, 2016, which is a continuation of U.S. patent application Ser. No. 14/954,427, filed Nov. 30, 2015, now U.S. Pat. No. 9,284,049, issued Mar. 15, 2016, and of U.S. patent application Ser. No. 14/947,923, filed Nov. 20, 2015, now U.S. Pat. No. 9,321,530, issued Apr. 26, 2016. U.S. application Ser. Nos. 14/954,427 and 14/947,923 are continuations of U.S. patent application Ser. No. 14/836,344, filed Aug. 26, 2015, now U.S. Pat. No. 9,233,754, issued on Jan. 12, 2016, which is a continuation of U.S. patent application Ser. No. 14/515,357, filed Oct. 15, 2014, now U.S. Pat. No. 9,221,536, issued on Dec. 29, 2015, which is a continuation of U.S. patent application Ser. No. 14/092,653, filed Nov. 27, 2013, now U.S. Pat. No. 9,016,617, issued on Apr. 28, 2015, which is a continuation-in-part of International Application No. PCT/CN2013/087053, filed Nov. 13, 2013, which claims the benefit of Chinese Patent Application No. 201220686731.2, filed Dec. 13, 2012, and Chinese Patent Application No. 201220604396.7, filed Nov. 15, 2012, the disclosures of each of which are incorporated herein by reference in theft entirety.

BACKGROUND OF THE INVENTION

In recent years, unmanned aerial vehicles (UAVs) have been widely used in various fields such as aerial photography, surveillance, scientific research, geological survey, and remote sensing. Typically, the UAVs carry onboard a variety of electrical components used to control various aspects of the operation of the UAVs. At the same time, the UAVs sometimes also need to carry one or more sensors for navigational, surveillance or remote sensing purposes. However, the operation of some of such sensors can be affected by interference from the electrical components, thereby reducing the reliability of such UAVs.

Furthermore, assembly of the UAV and configuration/calibration of the sensors are typically required for the UAVs to function properly. When such assembly, configuration or calibration is performed by untrained users, user mis-configuration or assembly errors can lead to malfunction or damage to the UAVs. Therefore, there is a need for a UAV with improved reliability by addressing the above-mentioned problems.

SUMMARY OF THE INVENTION

Methods and apparatus for providing improved unmanned aerial vehicles (UAVs) are provided. According to an aspect of the present invention, an unmanned aerial vehicle (UAV) is provided. The UAV comprises a housing comprising an outer surface and an inner surface that forms a cavity; one or more electrical components disposed inside the cavity and adapted to control operation of the UAV; and a sensor located outside the housing, operation of the sensor being susceptible to interference caused by the one or more electrical components.

According to another aspect of the present invention, an unmanned aerial vehicle (UAV) is provided. The UAV comprises one or more pre-configured electrical components that are pre-configured by a manufacturer prior to use of said UAV by a user, said one or more electrical components including at least a flight control module or an electronic speed control (ESC) module; and a sensor located on said UAV at a position separate from said one or more pre-configured electrical components, operation of the sensor being susceptible to interference caused by the one or more pre-configured electrical components.

According to yet another aspect of the present invention, the present invention provides an unmanned aerial vehicle (UAV) comprising one or more electrical components adapted to control operation of the UAV; and a sensor located on an extension member extending away from said one or more electric components, operation of the sensor being susceptible to interference caused by the one or more electrical components.

According to yet another aspect of the present invention, the present invention provides an unmanned aerial vehicle (UAV) comprising one or more electrical components adapted to control operation of the UAV; and a sensor located at least 3 cm away and at most 0.5 m away from the one or more electrical components, operation of the sensor being susceptible to interference caused by the one or more electrical components.

According to still yet another aspect of the present invention, the present invention an unmanned aerial vehicle (UAV) is provided. The UAV comprises one or more electrical components adapted to control operation of the UAV, the one or more electrical components including a GPS receiver; and a sensor including at least a magnetometer located on said UAV at a position separate from the one or more electrical components, operation of the magnetometer being susceptible to interference caused by the one or more electrical components.

In some embodiments, the sensor is located on an extension member extending from the housing and away from the cavity. The extension member includes a support member adapted to support, in whole or in part, weight of said UAV when said UAV is not airborne. The support member can include a landing stand. Alternatively, the sensor can be located directly on the outer surface of the housing. The UAV can comprise one or more rotors and the sensor can be located underneath the one or more rotors.

In some embodiments, the minimum distance between the sensor and the one or more electrical components is at least about 3 centimeters. In some embodiments, the maximum distance between the sensor and the one or more electrical components is at most 0.5 meters.

In some embodiments, at least one of the electrical components is pre-configured, by a manufacturer of the UAV. The at least one pre-configured electrical component can be used to form an electric unit necessary and sufficient for controlling operation of said UAV. The electrical unit can include at least one of a flight control module, GPS receiver or electronic speed control (ESC) module.

In some embodiments, the sensor is adapted to measure magnetic fields. The sensor can include a magnetometer. The magnetometer can include a compass. In some embodiments, the interference can include magnetic interference or electromagnetic interference. In some embodiments, the one or more electrical components can include a GPS receiver or an actuator assembly comprising a rotor blade and an actuator configured to actuate the rotor blade. In some embodiments, the one or more electrical components include at least three actuator assemblies.

In some embodiments, the housing comprises a conductive shielding material. The housing can comprise an upper housing member and a lower housing member that are removably coupled to form the cavity. The housing can comprise a central housing member connected to one or more branch housing members, the central housing member forming a central cavity and the one or more branch housing members forming corresponding one or more branch cavities. In some embodiments, at least one of the one or more electrical components is located inside the central cavity. The at least one electrical component located inside the central cavity can include at least one of a power source, flight control module, inertial measurement unit (IMU), or GPS receiver. In some embodiments, at least one of the one or more electrical components is located inside one of the one or more branch cavities. The at least one electrical component located inside one of the one or more branch cavities can include an electronic speed control (ESC) module or an actuator. In some embodiments, the one or more branch housing members respectively correspond to one or more rotors of the UAV. At least one of the one or more branch housing members can be removably connected to the central housing member.

According to another aspect of the present invention, a method is provided for reducing interference experienced by a sensor susceptible to the interference from one or more electrical components of an unmanned aerial vehicle (UAV). The method comprises providing a UAV described herein, thereby reducing said interference.

According to another aspect of the present invention, a kit for assembling an unmanned aerial vehicle (UAV) is provided. The kit comprises (a) one or more electrical components adapted to control operation of the UAV, and/or one or more rotor blades of said UAV; and (b) instructions comprising information for a user of said UAV to assemble component(s) of (a) with a magnetometer, such that when the UAV is assembled, the UAV is characterized in that it comprises: (1) (i) a housing comprising an outer surface and an inner surface that forms a cavity, disposed inside the cavity, the one or more electric components, and (ii) the magnetometer is located outside the housing; or (2) (i) a housing comprising an outer surface and an inner surface that forms a cavity, disposed inside the cavity, the one or more electric components, and (ii) the magnetometer is located at least 3 cm away from the one or more electrical components; or (3) (i) the one or more electrical component adapted to control operation of the UAV, and/or one or more rotor blades of said UAV, and (ii) a magnetometer located at least 3 cm away and at most 0.5 m away from the one or more electrical components.

According to another aspect of the present invention, the present invention provides an alternative kit for assembling an unmanned aerial vehicle is provided. The kit comprises (a) magnetometer; and (b) instructions comprising information for a user of said UAV to assemble said magnetometer with one or more electrical components adapted to control operation of the UAV, such that when the UAV is assembled, the UAV is characterized in that it comprises (1) (i) a housing comprising an outer surface and an inner surface that forms a cavity, disposed inside the cavity, the one or more electric components, and (ii) the magnetometer is located outside the housing; or (2) (i) a housing comprising an outer surface and an inner surface that forms a cavity, disposed inside the cavity, the one or more electric component, and (ii) the magnetometer is located at least 3 cm away from the one or more electrical component; or (3) (i) the one or more electrical component adapted to control operation of the UAV, and/or one or more rotor blades of said UAV, and (ii) a magnetometer located at least 3 cm away and at most 0.5 m away from the one or more electrical components.

According to another aspect of the present invention, the present invention provides a kit for assembling an unmanned aerial vehicle, the kit comprising (a) a housing comprising an outer surface and an inner surface that forms a cavity; (b) one or more pre-configured electrical components disposed inside the cavity and adapted to control operation of the UAV; (c) a magnetometer, operation of the magnetometer being susceptible to interference caused by the one or more electrical components; and (d) instructions for assembling said UAV, such that when the UAV is assembled according to the instructions, the assembled UAV is characterized in that: (1) the magnetometer is located outside the housing; or (2) the magnetometer is located at least 3 cm away from the one or more electrical component; or (3) the magnetometer is located at most 0.5 m away from the one or more electrical components.

In some embodiments, the kit further comprises a housing comprising an outer surface and an inner surface that forms a cavity and wherein the one or more electrical components are located inside the cavity. In some embodiments, the kit further comprises a housing comprising an outer surface and an inner surface that forms a cavity and wherein the magnetometer is located inside the cavity.

In some embodiments, the kit further comprises an extension member attachable to the housing and wherein the assembled UAV is further characterized in that: the extension member is attached to the outer surface of the housing and extending away from the cavity and the magnetometer is located on the extension member.

According to another aspect of the present invention, a method of assembling an unmanned aerial vehicle (UAV) is provided. The method comprises following instructions provided in a kit comprising one or more electrical components adapted to control operation of the UAV, and/or one or more rotor blades of said UAV, thereby assembling said UAV, wherein said UAV when assembled is characterized in that it comprises: (1) (i) a housing comprising an outer surface and an inner surface that forms a cavity, disposed inside the cavity, the one or more electric components, and (ii) the magnetometer is located outside the housing; or (2) (i) a housing comprising an outer surface and an inner surface that forms a cavity, disposed inside the cavity, the one or more electric components, and (ii) the magnetometer is located at least about 3 cm away from the one or more electrical components; or (3) (i) the one or more electrical component adapted to control operation of the UAV, and/or one or more rotor blades of said UAV; (ii) a magnetometer located at least 3 cm away and at most 0.5 m away from the one or more electrical components.

According to another aspect of the present invention, a method of assembling an unmanned aerial vehicle (UAV) is provided. The method comprises following instructions provided in a kit comprising a magnetometer to incorporate said magnetometer into said UAV, thereby assembling said UAV, wherein said UAV when assembled is characterized in that it comprises (1) (i) a housing comprising an outer surface and an inner surface that forms a cavity, disposed inside the cavity, the one or more electric components, and (ii) the magnetometer is located outside the housing; or (2) (i) a housing comprising an outer surface and an inner surface that forms a cavity, disposed inside the cavity, the one or more electric components, and (ii) the magnetometer is located at least 3 cm away from the one or more electrical component; or (3) (i) the one or more electrical components adapted to control operation of the UAV, and/or one or more rotor blades of said UAV; (ii) a magnetometer located at least 3 cm away and at most 0.5 m away from the one or more electrical components.

In some embodiments, the step of following instructions comprises connecting one or more rotor blades to the one or more electrical components, and said step further comprising placing said magnetometer at a position on said UAV where said magnetometer does not experience significant electromagnetic interference from said one or more electrical components.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Figure 1:
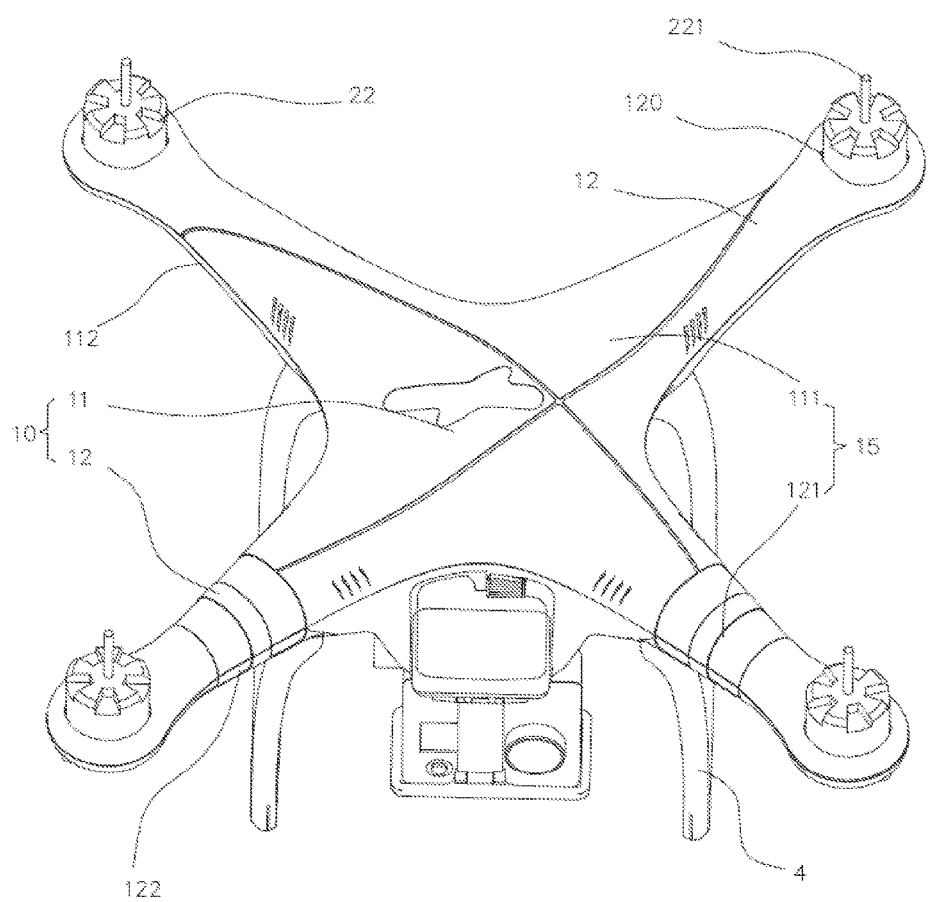
FIG. 1 illustrates a multi-rotor unmanned aerial vehicle (UAV) without the rotor blades, in accordance with an embodiment.

The present invention provides methods and apparatus for improving reliability unmanned aerial vehicles (UAVs). According to an aspect of the present invention, interference experienced by certain onboard sensors is reduced. Such interference can be caused by onboard electrical components. The interference can include electromagnetic interference, magnetic interference, and the like. The onboard sensors which operation is susceptible or sensitive to such interference may include sensors adapted to measure magnetic fields such as magnetometers, compass, and the like. To reduce the interference experienced by such "interference-susceptible" sensors, the interference-generating electrical components can be positioned inside a cavity of a UAV formed by the inner surface of the body of the UAV. The interference-susceptible sensor or sensors can be positioned outside the cavity. In some embodiments, the sensors can be located on an extension member of the UAV. The extension member can include a support member of the UAV, such as a landing stand. In some other embodiments, the sensors can be located directly an outer or inner surface of the UAV body but separately from the electrical components. Advantageously, the separation of the interference-generating electrical components and the interference-susceptible sensors reduces the interference experienced by the sensors, thereby improving the reliability of the sensors and the UAV.

According to another aspect of the present invention, the reliability of the UAV can be further improved by reducing user-caused mis-configuration or mis-assembly of components. Some or all electrical components can be pre-configured, pre-connected or otherwise pre-installed by a manufacturer of the UAV. As such, little or no user assembly or configuration is required for the UAVs to function properly. In addition, since the components are pre-configured by experienced workers, the likelihood of mis-configuration is further reduced. In some embodiments, one or more electric components are pre-configured by a manufacturer of the UAV to form an electrical unit necessary and sufficient for controlling operation of the UAV.

In various embodiments, the UAVs described herein may include UAVs of various types, sizes, shapes, and configurations. For example, the UAVs may include multi-rotor aircrafts such as helicopters, quadcopters, hexacopters, octocopters, and the like. Furthermore, the UAVs described herein may be used in a wide variety of applications including but not limited to remote sensing, aerial surveillance, oil, gas and mineral exploration and production, transportation, scientific research, aerial photography or videography, mapping, disaster reporting, search and rescue, mapping, power line patrol, weather reporting and/or prediction, traffic detection and reporting.

In various embodiments, a UAV may be autonomously-controlled by an onboard controller or processor, remotely-controlled by a remote device (e.g., a ground station or a hand-held remote control device), or jointly controlled by both. In some embodiments, the UAV may be configured to carry a payload device such as a camera or a video camera via a carrier. The payload device may be used to capture images of surrounding environment, collect samples, or perform other tasks.

As used herein, the terms "upper," "lower," "vertical," "horizontal" and other similar position-indicating terms are used with reference to the UAV in its normal operational mode, and should not be considered limiting. Throughout the description, a quadcopter (a helicopter with four rotors) is used as a UAV for illustrative purposes only. It is appreciated that the techniques described herein can be used for other types of UAVs such as a hexacopter or an octocopter.

As used herein, the term "body" is used interchangeably with the term "housing."

As used herein, the term "electrical component" refers to any component that provides, uses or transmits electricity.

FIG. 1 illustrates a multi-rotor unmanned aerial vehicle (UAV) without the rotor blades, in accordance with an embodiment. As illustrated, the UAV comprises a hollow body portion 10 that comprises an outer surface and an inner surface. The inner surface of the body portion encloses a cavity (shown as 13 in FIG. 2) inside the body portion. As will be discussed in more detail in connection with FIG. 2, one or more electrical components adapted to control various aspects of the operation of the UAV may be disposed inside the cavity. Such electrical components can include an energy source (e.g., battery), flight control or navigation module, GPS module (e.g., GPS receivers or transceivers), inertial measurement unit (IMU) module, communication module (e.g., wireless transceiver), electronic speed control (ESC) module adapted to control an actuator (e.g., electric motor), actuator(s) such as an electric motor used to actuate a rotor blade or rotor wing of the UAV, electrical wirings and connectors, and the like. In some embodiments, some of the electrical components may be located on an integrated electrical unit such as a circuit board or module. One or more electrical units may be positioned inside the cavity. When in use, the electrical components discussed herein may cause interference (e.g., electromagnetic interference) to other components (e.g., magnetometer) of the UAV. In some embodiments, the interference may be caused by ferrous material or static sources of magnetism. For example, the electrical components may comprise magnets that generate magnetic fields, thereby causing magnetic interference.

As illustrated by FIG. 1, the body portion 10 of the UAV comprises a central housing member 11 and one or more branch housing members 12. The inner surface of the central housing member can form a central cavity (shown as 113 in FIG. 2). Each of the branch housing members 12, in the shape of a hollow arm or any other suitable shape, can form a branch cavity (shown as 123 in FIG. 2). When the central housing member is connected to the one or more branch housing members, the central cavity and the one or more branch cavities can collectively form one unified cavity (shown as 13 in FIG. 2).

The branch housing members 12 can be connected to the central housing member 11 in an "X" or star shaped arrangement. Specifically, the central housing member 11 can be located at the center of the X or star shaped arrangement whereas the branch housing members 12 can be distributed around the central housing member 11, in a symmetric or asymmetric fashion. In some embodiments, such a star-shaped arrangement can facilitate efficient electrical connection between electrical components disposed within the cavity of the housing, such as between a centrally located flight control module and the individual ESC modules located in respective branch cavities. Or between a centrally located energy source (e.g., battery) and actuators (e.g., electric motors) used to drive the rotors of a multi-rotor UAV. In other embodiments, the housing and/or the cavity inside the housing of the UAV may have a shape other than the star shape described herein. For example, the housing and/or the cavity inside the housing can form a substantially spherical, elliptical, or cylindrical shape or any other shape.

In a typical embodiment, the number of branch housing members 12 is equal to the number of rotors or actuator assemblies of the UAV. An actuator assembly (shown as 2 in FIG. 2) can include a rotor wing or rotor blade (shown as 21 in FIG. 2) and an actuator (shown as 22 in FIG. 2) that is used to actuate the rotor blade. For example, a four-rotor quadcopter such as illustrated in FIG. 1 may have four branch housing members 12, each corresponding to one of the four rotors or actuator assemblies. In the illustrated embodiment, the UAV has four branches, each corresponding to one actuator assembly 2. That is, the UAV has four actuator assemblies 2. In various embodiments, the number of the branches and/or the arrangement thereof may be different from those illustrated herein. For example, in some embodiments, there may be more or less branch housing members and/or rotors or actuator assemblies than illustrated here. For example, a 6-rotor UAV may have six rotors or actuator assemblies and six corresponding branch housing members. A 8-rotor UAV may have eight rotors or actuator assemblies and eight corresponding housing members. In alternative embodiments, the number of branch housing members may not correspond to the number of rotors or actuator assemblies of the UAV. For example, there may be more or less branch housing members than actuator assemblies. In various embodiments, the numbers of branches, actuator assemblies, and actuators can be adjusted according requirements of actual circumstances. To ensure stability of the UAV during operation, a typical multi-rotor UAV has no less than three rotors.

In some embodiments, the branch housing members 12 can be removably coupled to the central housing member 11. For example, each branch housing member 12 can be connected to and/or disconnected from the central housing member 11 by rotating the branch housing member 12 as a whole. In some embodiments, the branch housing members 12 may be foldable relative to the central housing member 11, for example, to facilitate storage and/or transportation of the UAV. In such embodiments, the branch housing members 12 can be expanded from the folded position and/or reconnected to the central housing member in order to put the UAV back to use.

Figure 2:
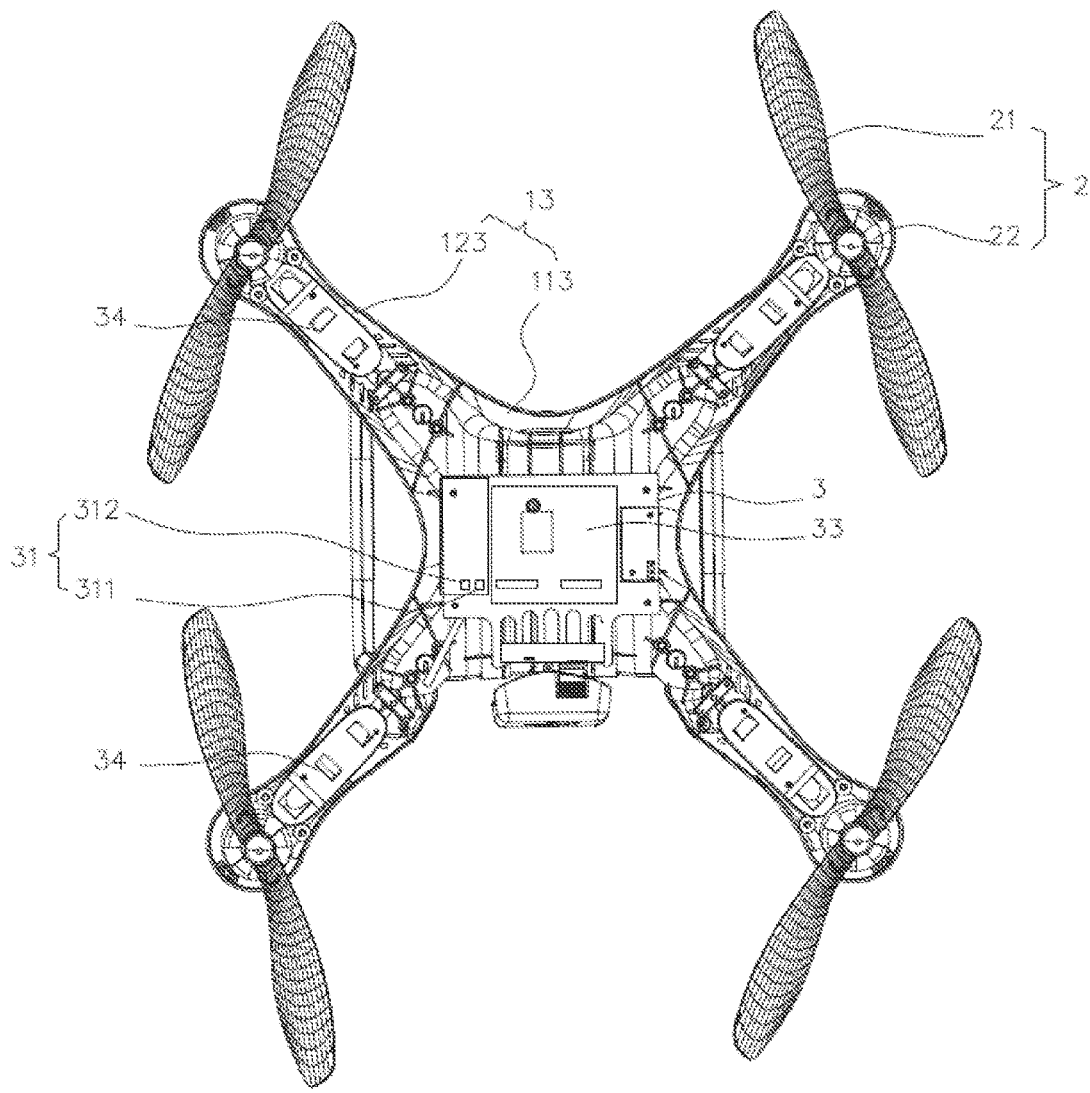
FIG. 2 illustrates a top view of the multi-rotor UAV of FIG. 1 without the top portion of the housing to show the interior components, in accordance with an embodiment.

In some embodiments, the central housing member 11 can include an upper central housing member 111 and a corresponding lower central housing member 112 that collectively form the central cavity (shown as 113 in FIG. 2). Each of the branch housing members 12 can include an upper branch housing member 121 and a corresponding lower branch housing member 122 that collectively form the branch cavity (shown as 123 in FIG. 2). The upper branch housing members 121 of the branch housing members 12 may provide a mounting or positioning structure 120 such as a slot or opening for installing the actuator 22 of the actuator assembly (shown as 2 in FIG. 2).

Figure 3:
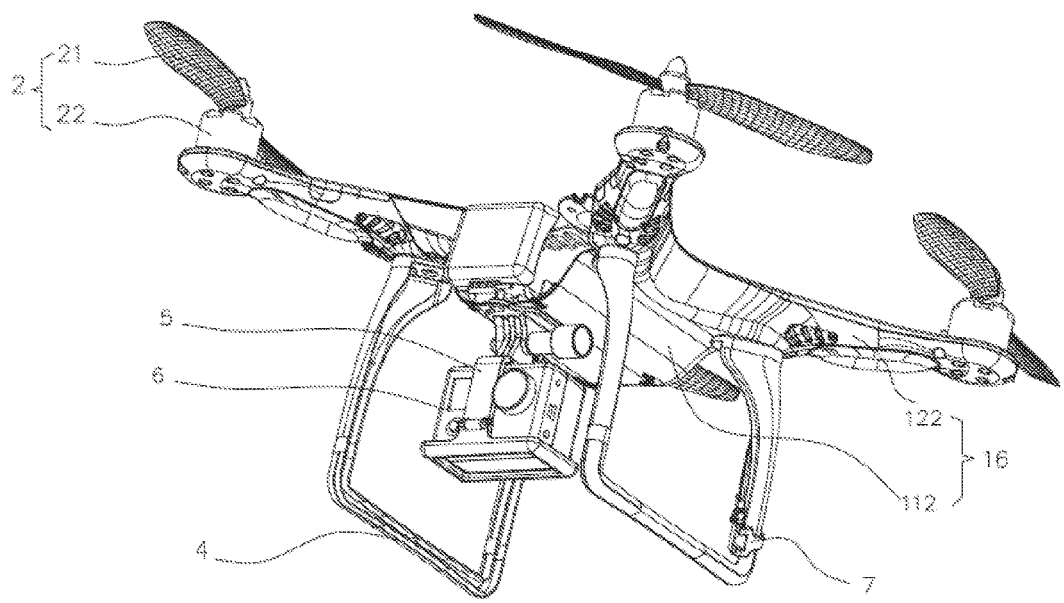
FIG. 3 illustrates another view of the multi-rotor UAV of FIG. 1, in accordance with an embodiment.

In some embodiments, the upper branch housing members 121 and the upper central housing member 111 forms an upper body portion 15 and the lower branch housing members 122 and the lower central housing member 112 forms the lower body portion (shown as 16 in FIG. 3). The body portion 10 can be considered the combination of the upper body portion 15 and the lower body portion 16. In some embodiments, the upper body portion 15 and the lower body portion 15 may be removably coupled to form the body portion 10. For example, during assembly of the body portion 10, the upper body portion and the lower body portion may be removably coupled via fasteners such as screw, bolt, buckle, clamp, clasp, latch, hook, nail, pin, strap, cable, or the like. Such removable coupling can be used to facilitate maintenance of the UAV. When maintenance is required, the upper body portion can be decoupled from the lower body portion to allow direct observation and maintenance of interior components of the body portion. In another embodiment, the upper body portion and the lower body portion may be welded or otherwise permanently held together.

In various embodiments, any individual or combination of the components that form the housing of the UAV can be manufactured using any suitable technique such as injection molding, additive manufacturing (3-D printing) techniques, or the like. For example, each of the upper central housing member, lower central housing member, upper branch housing member and lower branch housing member can be manufactured individually and welded, fastened or otherwise combined to form the overall housing. As another example, one or more upper branch housing members and the upper central housing member can be integrally manufactured as one piece (i.e., forming the upper body portion);

whereas one or more lower branch housing members and the lower central housing member can be integrally manufactured as another whole piece (i.e., forming the lower body portion). Then, the two integrally manufactured pieces can be combined (via welding, fastener, etc.) to form the body portion of the UAV. As yet another example, the upper central housing member and the lower central housing member can be integrally manufactured as one piece (i.e., forming the central housing member); whereas for each of the branch housing members, the upper branch housing member and the lower branch housing member can be integrally manufactured as one piece (i.e., forming a branch housing member). The central housing member and the branch housing members can then be combined via welding, fastener, or the like. As yet another example, the entire housing of the UAV can be integrally manufactured, for example, using injection molding or additive manufacturing techniques.

As illustrated in FIG. 1, the UAV can optionally include one or more support members 4 that are attached or attachable to the body portion 10. The support members 4 may be used to support in whole or in part the weight of the UAV when the UAV is not airborne. An example of a support member can include a landing stand provided to facilitate the landing of the UAV. As discussed herein, such a support member can also be used to support a sensor that is susceptible to the interference of the electrical components of the UAV.

In some embodiments, the UAV includes one or more receiving structures to accommodate some or all of the components of the UAV, such as some of the electrical components discussed herein. Such receiving structures may be coupled to the housing and may be an integral part of the housing. The receiving structures may be positioned on the outer surface of the body portion or inside the cavity. As an example, a receiving structure may be formed by the structure of the inner or outer surface of the body portion. In an embodiment, the receiving structure may form an addition receiving cavity besides the main cavity. In another embodiment, the receiving structure may be formed by interior structures on the inner surface of the main cavity. In an embodiment, the receiving structures are all located inside the cavity. In another embodiment, some of the receiving structures are located outside cavity. The receiving structures may include slots, grids, housing, or other similar structures to accommodate various components of the UAV. For example, the receiving structure may include a slot on the interior surface of the cavity formed by the body of the UAV that can be used to accommodate a circuit module, battery, ESC module or the like. In some embodiments, the UAV may not include any additional receiving structures other than the cavity formed by the housing of the UAV. In some other embodiments, some or all of the electrical components may be directly attached or coupled to the UAV without the use of receiving structures.

The body portion and/or a receiving structure can include an opening for placing and/or retrieving components thereto or therefrom. For example, such an opening may allow users to retrieve the battery from the cavity of the body portion or the receiving structure for recharge and for putting the battery back after the recharge. The opening may optionally have a corresponding flap or cover member that is hingedly coupled to the body portion. The cover may be closed, such as by a clasp, buckle, strap, or the like, to secure the components located therein.

FIG. 2 illustrates a top view of the multi-rotor UAV of FIG. 1 without the top portion of the housing to show the interior components, in accordance with an embodiment. As discussed above, to avoid or reduce interference with the interference-susceptible or interference-susceptible sensors such as magnetometers (e.g., compass), one or more interference-generating electrical components of the UAV can be located separately from the interference-susceptible sensors. In an embodiment, the electrical components are disposed inside the cavity 13 formed by the inner surface of the housing of the UAV as discussed in connection with FIG. 1 while the sensor is located outside the housing. Additionally, housing can provide protection to the electrical components and increase the strength and rigidity of the UAV, making it well-adapted to transportation and storage. In another embodiment, the sensor is also located inside the housing but separately from the electrical components.

In various embodiments, the one or more electrical components may be adapted to control various aspects of the operation of the UAV. Such electrical components can include an energy source (e.g., battery), flight control or navigation module, GPS module (e.g., GPS receivers or transceivers), inertial measurement unit (IMU) module, communication module (e.g., wireless transceiver), electronic speed control (ESC) module adapted to control an actuator (e.g., electric motor), actuator such as an electric motor that is used to actuate a rotor blade or rotor wing of the UAV, connecting members configured to electrically connect the electrical components (such as electrical wirings and connectors), and the like. In various embodiments, some or all of the electrical components of the UAV may be located inside the housing.

In some embodiments, some of the electrical components discussed above may be located on one or more circuit modules 3. Each circuit module can include one or more electrical components. For example, as shown in FIG. 2, the circuit module 3 can include the main flight control module 33 that includes one or more processors (such as implemented by a field-programmable gate array (FPGA)) for controlling key operations of the UAV. As another example, the same or a different circuit module can also include an IMU module for measuring the UAV's velocity, orientation and/or gravitational forces. The IMU module can include one or more accelerometers and/or gyroscopes. As another example, the same or a different circuit module can also include a communication module 31 for remotely communicating with a remote control device. For example, the communication module can include a wireless (e.g., radio) transceiver. The communication module 31 can be provided with button or buttons 311 and corresponding indicator light 312 that is spaced apart from the code buttons. The buttons and the indicator light may be used for facilitate communication between the UAV and a remote control device. For example, the buttons may be used to adjust the frequency channel used by the UAV and the indicator light can be used to indicate the success and/or failure of the establishment of a communication channel between the UAV and the remote control device.

The flight control module 33 is typically a key component or "brain" of an UAV. For example, the flight control module 33 can be configured to estimate the current velocity, orientation and/or position of the UAV based on data obtained from visual sensors (e.g., cameras), IMU, GPS receiver and/or other sensors, perform path planning, provide control signals to actuators to implement navigational control, and the like. As another example, the flight control module can be configured to issue control signals to adjust the state of the UAV based on remotely received control signals.

In some embodiments, the electrical components located inside the cavity can include a GPS receiver. Traditionally, a GPS receiver is typically co-located with a magnetometer. However, when the GPS receiver and magnetometer are located close to the other electrical components, the operation of the magnetometer can be affected by the interference from the other electrical components. In some embodiments, operation of the magnetometer can also be affected by interference from the GPS receiver. Therefore, in a preferred embodiment of the present invention, the GPS receiver is separated from the magnetometer so that the GPS receiver is located inside the housing the UAV and the magnetometer is located outside the housing. In alternative embodiments, the GPS receiver and the magnetometer may both be located inside or outside the housing but there is a minimum distance between the GPS receiver and the magnetometer. In an embodiment, such a minimum distance is about 3 centimeters (3 cm). In other embodiments, the minimum distance can be less or more than 3 cm.

In some embodiments, the electrical components located inside the cavity can include one or more electronic speed control (ESC) modules 34. An ESC module can be adapted to control the operation of an actuator 22. The actuator 22 can be part of an actuator assembly 2 and configured to actuator a rotor blade or wing 21 of the UAV. In some embodiments, the ESC module can be electrically connected to the flight control module 33 on the one hand, and an actuator 22 on the other hand. The flight control module 33 can provide control signals for the ESC module 34, which in turn provides actuator signals to the electrically connected actuator 22 so as to actuate the corresponding rotor blade 21. In some embodiments, feedback signals can also be provided by the actuator 22 and/or the ESC module 34 to the flight control module 33. In a typical embodiment, the number of ESC modules is equal to the number of rotor actuators of the UAV. For example, a 4-rotor UAV has four ESC modules. In an alternative embodiment, the number of ESC modules may be different (more or less) than the number of rotor actuators. In some embodiments, the ESC modules may be optional. In some embodiments, instead of or in addition to the ESC module, other types of actuator control module can be provided to control the operation of the actuators.

In some embodiments, the UAV also includes one or more connecting members for electrically coupling or connecting the various electrical components of the UAV. Such connecting members can include electrical wires, cables, and the like that are used for transmitting power, data or control signals between the components. For example, the connecting members can be used to electrically connect 1) an energy source and an actuator assembly; 2) a circuit module and an ESC module; 3) an ESC module and an actuator; 4) a communication module and a circuit module, or the like. In some embodiments, the connecting members have pluggable connectors at the distal portions to facilitate plugging and unplugging of the connecting members with respect to the electrical components.

As discussed above in connection with FIG. 1, the cavity of the UAV can be of any suitable shape. In various embodiments, the locations of the various electrical components can be determined based on the design and layout of the UAV. In some embodiments, the cavity of the UAV includes a central cavity 113 and multiple branch cavities 123, each corresponding to a separate actuator assembly 2. In some embodiments, some of the electrical components can be located inside the central cavity whereas others may be located in the branch cavities. In other embodiments, all of the electrical components may be located in one portion (e.g., central cavity or branch cavity) of the cavity. In an embodiment, the key control components such as the flight control module and the energy source (e.g., battery) can be located in the central cavity whereas controlled components such as the ESC modules and the actuator assemblies are located in respective branch cavities. Such an arrangement provides efficient layout of electrical connection between the centrally-located components and components for which the centrally located components provide power and/or control signals and can facilitate space-optimization and miniaturization of the UAV.

In an embodiment, the ESC module 34 can be positioned inside a branch housing member and below the actuator. For example, the ESC module 34 can be located in the lower branch housing members 122 and within the branch cavity 123. The placement of the ESC module 34 inside the branch housing members 123 can facilitate the electric coupling between the ESC module 34 and the actuator 22. In alternative embodiments, at least one of the ESC modules 34 can be located inside the central cavity instead of a branch cavity.

In some embodiments, the actuator assembly 2 controlled by the ESC module can be located at least partially inside a branch cavity. The actuator assembly 2 can include actuator 22 that is connected to the branch housing members 12 and rotor blade 21 that is coupled to the actuator 22. As illustrated in FIG. 1, a portion of the actuator 22 can extend at least partially from the cavity to rotatably couple with a rotor blade or rotor wing (shown as 21 in FIG. 2). For example, the actuator can have a shaft 221 that is rotatably attachable to the rotor blade 21. The actuator 22 can includes electric motor, mechanical actuator, hydraulic actuator, pneumatic actuator, and the like. Electric motors can include magnetic, electrostatic, or piezoelectric motors. For example, in an embodiment, the actuator includes a brushless DC electric motor. The actuator assembly 2 can be fixedly or removably coupled to the branch housing members 12. In some embodiments, the UAV has at least three actuator assemblies to ensure stability of the UAV during operation.

In some embodiments, some or all of the electrical components discussed above are pre-configured, pre-assembled or pre-connected by a manufacturer of the UAV. In such embodiments, no or very little user assembly and/or calibrate may be required for the UAV to operate, making the UAV "ready-to-fly" out-of-the-box. Such pre-configuration of components not only enhances the user experience by lowering the technical expertise required, but also reduces the errors or accidents caused by user mis-configuration. In some embodiments, such pre-configured or pre-assembled components can include the flight control module, GPS receiver, ESC module, or any of the electrical components discussed herein, or any combination thereof. In some embodiments, one or more electrical components may be pre-configured, pre-connected or pre-assembled as an electrical unit (e.g., a circuit module). The electrical unit may be necessary and sufficient for controlling operation of the UAV. In some embodiments, no additional user configuration is required for the pre-configured components to operate properly out-of-the-box. In other embodiments, some amount of user configuration or assembly may be required.

In an embodiment, at least two of the electrical components may be pre-connected by a manufacturer of the UAV to reduce user assembly that is required before the UAV can be used. For example, the electrical connection between the circuit module and the ESC module may be pre-connected by the manufacturer so that the user need not connect the two modules after purchasing the UAV. Such pre-configuration, pre-connection or pre-assembly can also simplify the design of the UAV. For example, not all of the connecting members may need to provide pluggable connectors: some of the connecting members can be pre-connected to components, by the manufacturer, by welding, thereby improving the reliability of such connections. Even where pluggable connectors are used, such connections can be performed properly by trained professionals such as mechanics during factory assembly, thereby reducing the risk of loose and/or incorrect connections and further improving the reliability of the UAV.

FIG. 3 illustrates another view of the multi-rotor UAV of FIGS. 1-2, in accordance with an embodiment. The illustrated UAV shows the placement of an interference-susceptible sensor 7 (e.g., a magnetometer) outside the body portion of the UAV to reduce interference experienced by the sensor that is caused by one or more electrical components of the UAV such as those discussed in connection with FIG. 2.

In various embodiments, the interference-susceptible sensor 7 includes a sensor which operation is susceptible to interference caused by the onboard electrical components. The interference may include electromagnetic or magnetic interference. The interference may be caused by the electric current or magnets in the electric components. The interference-susceptible sensor 7 can include a magnetometer. Magnetometers may include scalar and/or vector magnetometers. In an embodiment, the magnetometer includes a compass. In a preferred embodiment, the interference-susceptible sensor 7 includes magnetometer but not a GPS receiver. In an alternative embodiment, the interference-susceptible sensor 7 includes a GPS receiver and a magnetometer. It is appreciated that while one interference-susceptible sensor is used for illustrative purpose, more than one interference-susceptible sensor may be carried by the UAV and the interference-reduction techniques described herein may be used for any or all of such interference-susceptible sensors.

In some embodiments, to reduce interference from electrical components of the UAV and to improve the reliability of the UAV, the interference-susceptible sensors are positioned at some distance from the electrical components that tend to generate such interference. For example, all electrical components that generate interference to the interference-susceptible sensor can be placed away from the sensor. In other embodiments, only some of the interference-generating electrical components are located away from the sensor. Some or all of the interference-generating electrical components can be placed at least about 3, 4, 5, 6, 7, 8, 9, 10 or more centimeters away from the sensor. In some instances, some or all of interference-generating electrical components are placed within a distance of about 3 centimeters from about 0.5 meters.

In some embodiments, such as discussed in connection with FIGS. 1-2, the interference-generating electrical components are located inside the cavity of the body portion of the UAV whereas the interference-susceptible sensor is located outside the cavity of the body. In some embodiments, the sensor is located on an extension member extending from the housing and away from the cavity therein. In some embodiment, the extension member may include a support member that is adapted to support, in whole or in part, weight of the UAV when the UAV is not airborne. For example, the support member may include a landing stand 4 such as illustrated in FIG. 3. In an alternative embodiment, the UAV does not have a stand or similar structure such as that when the UAV is positioned on a given surface, the outer surface of the lower central housing directly contact the surface. In some embodiments, the sensor may be located outside the cavity and on the outer surface of the housing. More detailed discussion of some embodiments is provided in connection with FIGS. 5-8.

In some embodiments, the minimum distance between the sensor and the electrical components is set to be no more than a predefined threshold value regardless of the locations of the sensor or the electrical components. For example, in an embodiment, the electrical components and the sensor may be both located inside the housing or both outside the housing but the minimum distance is at least about 3 cm. In some embodiments, the minimal distance can be less than 3 cm. As used herein, the minimum distance between a sensor and a plurality of electrical components is the shortest distance between the sensor and any of the plurality of electrical components. The maximum distance is similarly defined. For example, if a flight control module, an ESC module and an actuator are located 4 cm, 7 cm and 8 cm from a magnetometer, the minimum distance between the magnetometer and this group of electrical components is 4 cm and the maximum distance is 8 cm. In some embodiments, the maximum distance between the interference-susceptible sensor and any interference-generating electrical component is also set to be no more than a predefined threshold value, for example, 0.5 meter (0.5 m). In other embodiments, the maximum distance can be more than 0.5 m. In various embodiments, the threshold value the minimum and/or maximum distance may be determined based at least in part on the shape and/or dimensions of the UAV, the characteristics of the interference-generating electrical components and the characteristics of the interference-susceptible sensor.

In some embodiments, the UAV may not have a housing such as illustrated in FIGS. 1-3 at all. In such embodiments, the separation of the interference-generating electrical components and interference-susceptible sensor may be sufficient to reduce the interference experienced by the interference-susceptible sensor. For example, in an embodiment, distance between the interference-susceptible sensor and any interference-generating electrical component is no less than 3 cm and no more than 0.5 m.

In various embodiments, additional interference reduction methods may be used in conjunction with the techniques described herein. Such methods may include the use of capacitors, filters, shielding, and the like. For example, in an embodiment, the inner surface and/or outer surface of the body portion may be made of a conductive shielding material to further reduce the interference caused by the electrical components.

In some embodiments, such as illustrated in FIG. 3, the UAV may carry a payload device 6 (e.g., camera or video camera) via a carrier 5. The carrier 5 may be coupled to the UAV and configured to be coupled to the payload device 6. In various embodiments, the operation of the payload device 6 and/or the carrier 5 can be controlled by an onboard control module (e.g., circuit module), a remote control device, or a combination of both.

In some embodiment, the central housing or the branch housing may be provided with an indicator light source (not shown). In an embodiment, the light source may be positioned at an opening or window on the branch housing such as towards the lower portion of the UAV away from the rotors). The opening or window may be covered by a window cover that is made of a transparent or semi-transparent material so as to allow passage of at least some of the light from the indicator light source. In a preferred embodiment, the indicator light source includes a light-emitting diode (LED) light, which provides high brightness, low power consumption, long-lasting life of use, and ease of transportation. In other alternative embodiments, the indicator light source, window and window cover can be located on the central housing.

Figure 4:
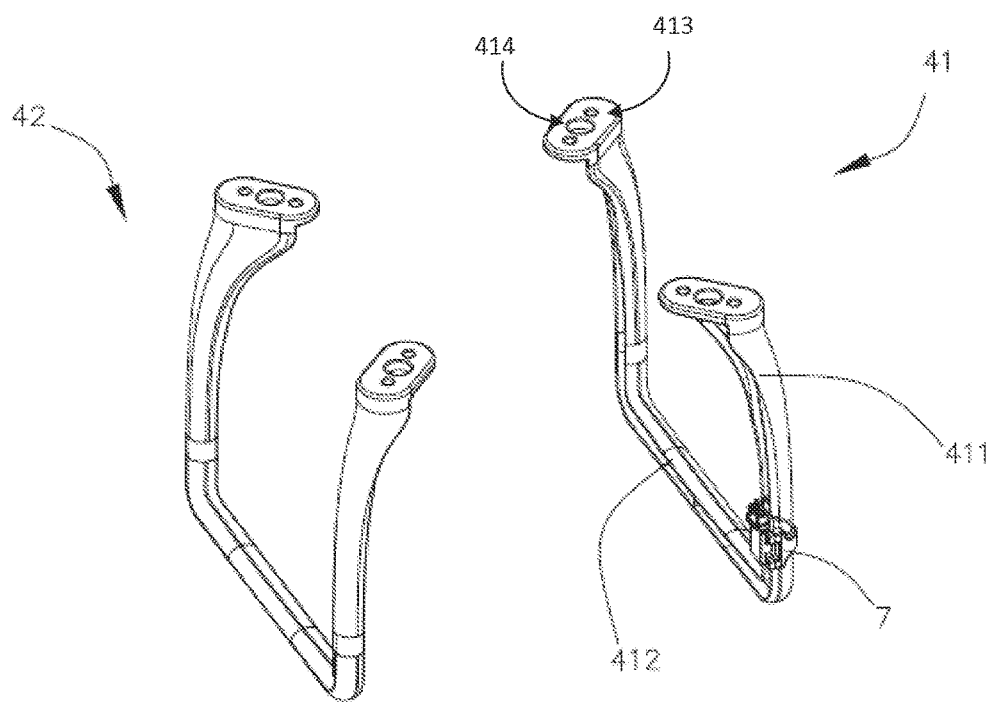
FIG. 4 illustrates support members of a multi-rotor UAV, in accordance with an embodiment.

FIG. 4 illustrates a pair of landing stands that may be used for attaching an interference-susceptible sensor, in accordance with an embodiment. The landing stands 4 may be similar to those illustrated in FIG. 3. As discussed above, the landing stand may be adapted to support, in whole or in part, the weight of the UAV when the UAV is not airborne. In an embodiment, the UAV has two similarly structured stands that are coupled to the body of the UAV and spaced apart at a suitable distance. In various embodiments, the UAV can include one, two, three or more stands. The stands can be attached the bottom of the housing (on the opposite side of the rotors) in any suitable configuration so as to support the weight of the body portion. The stands may also provide protection for any payload device (such as a camera or video camera) that may be located between the stands. Advantageously, using an existing structure of the UAV, such as a landing stand, requires no additional structure to be added to the UAV for increasing the distance between the interference-susceptible sensor and the interference-generating electrical components of the UAV, thereby reducing the weight and cost of the UAV while improving the aesthetic of the UAV.

In some embodiments, such as illustrated, the UAV may include a first stand 41 and a second stand 42. The interference-susceptible sensor may be located on the first stand 41 or the second stand 42. The description of the first stand 41 is provided in the following discuss as the first and second stands can have similar structures. The first stand 41 can have two substantially vertical support portions 411 which are connected by a substantially horizontal connecting portion 412. When in use, an interference-susceptible sensor 7 can be coupled to one of the support portions 411 and away from the source of the interference. For example, the sensor 7 can be disposed toward an end of the support portion and away from the source(s) of interference. In other embodiments, the sensor 7 may be located on a different portion of the first stand 41 than illustrated here. In some embodiments, each support portion 411 can have an attachment interface 413 which may be used to attach the support portion and hence the stand to a UAV. The attachment interface 413 can include one or more openings 414. Such openings may be used for allowing and securing the passage of wires connecting the interference-susceptible sensor and other components of the UAV such as the circuit module.

FIGS. 5-8 illustrate example configurations of interference-susceptible sensor and interference-generating electrical components, according to some embodiments.

Figure 5:
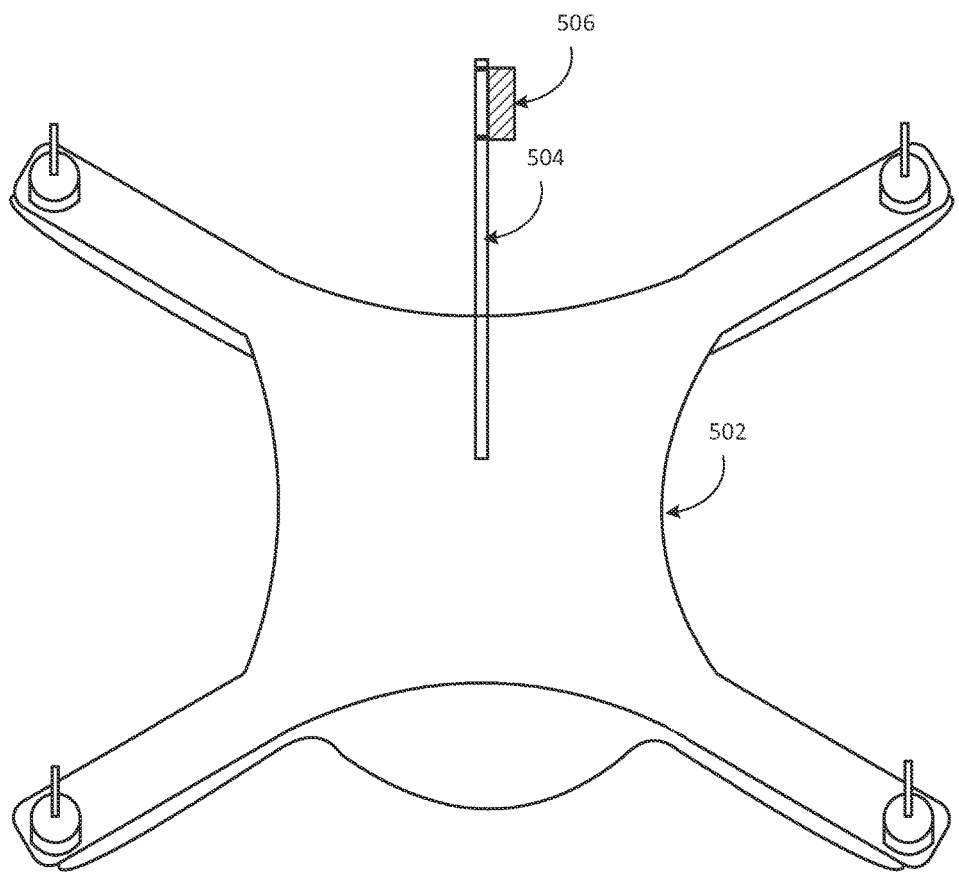
FIG. 5 illustrates a UAV with an extension member for attaching a sensor, in accordance with an embodiment.

As discussed herein, in some embodiments, the interference-generating electrical components can be located inside the cavity of a body of UAV and the interference-susceptible sensor can be located outside on an extension member that extends away from the cavity. FIGS. 5-6 illustrate some of such embodiments. Referring to FIG. 5, the body 502 of the UAV may enclose therein one or more interference-generating electrical components (not shown). An extension member 504 can be attached, at one end, to the outer surface of the body portion 502 of the UAV. An interference-susceptible sensor 506 can be coupled to a portion of the extension member 504 that is closer to the other end of the extension member 504 that is away from the cavity such that there is a distance between the interference-susceptible sensor 506 and the interference-generating electrical components. The sensor 506 may be coupled (removably or permanently) to the extension member 504 via a fastener, glue, welding or any other suitable methods. In various embodiments, the extension member 504 can include a pole, hook, platform, slot, or any other suitable structure. It is appreciated that in some embodiments, the interference-susceptible sensor can be operably connected to the interference-generating electrical components such as via a wired or wireless link. Such a link is not necessarily depicted in FIGS. 5-8. In an embodiment, the extension member may include a hollow cavity that allows for the passage of the wire(s) connecting the sensor and other component(s) of the UAV (not shown).

Figure 6A:
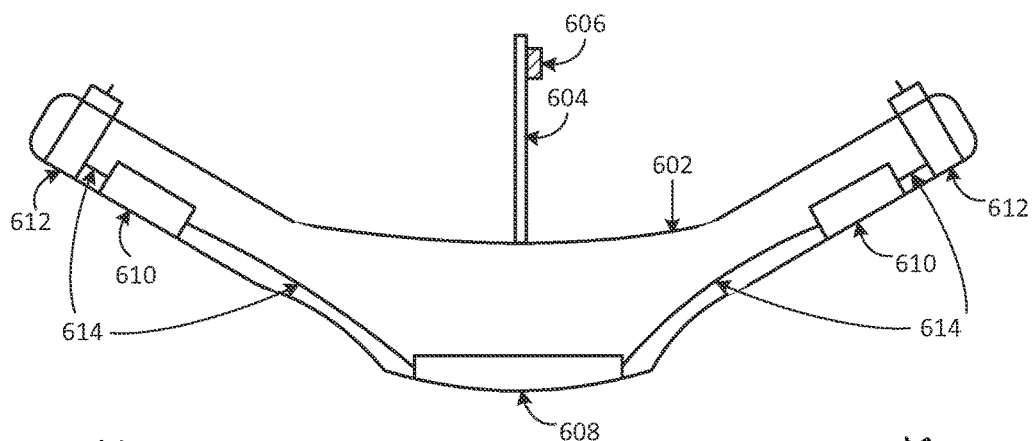
FIGS. 6a-c illustrate UAVs with extension members for attaching sensors, in accordance with some embodiments.

FIG. 6a illustrates a side view of the UAV shown in FIG. 5. As illustrated, the inner surface of the body portion 602 of the UAV forms a cavity. Interference-generating electrical components 608, 610, and 612 may be disposed inside the cavity. The interference-generating electrical components can also include one or more connecting members 614 that electrically connect some of the other electrical components. The interference-generating electrical components can include any of those described herein such as a circuit module, flight control module, GPS receiver, energy source, ESC module, actuator or actuator assembly, and the like. It is appreciated that in various embodiments, more or less interference-generating electrical components than illustrated may be provided. An extension member 604 is attached to the upper outer surface of the body of the UAV and extends away from the cavity. An interference-susceptible sensor 606 may be coupled (removably or permanently) to the extension member 604. In a typical embodiment, the interference-susceptible sensor 606 is located on a portion of the extension member 604 that is away from the cavity, such as towards a distal end that is not attached to the outer surface of the body of the UAV.

Figure 6B:
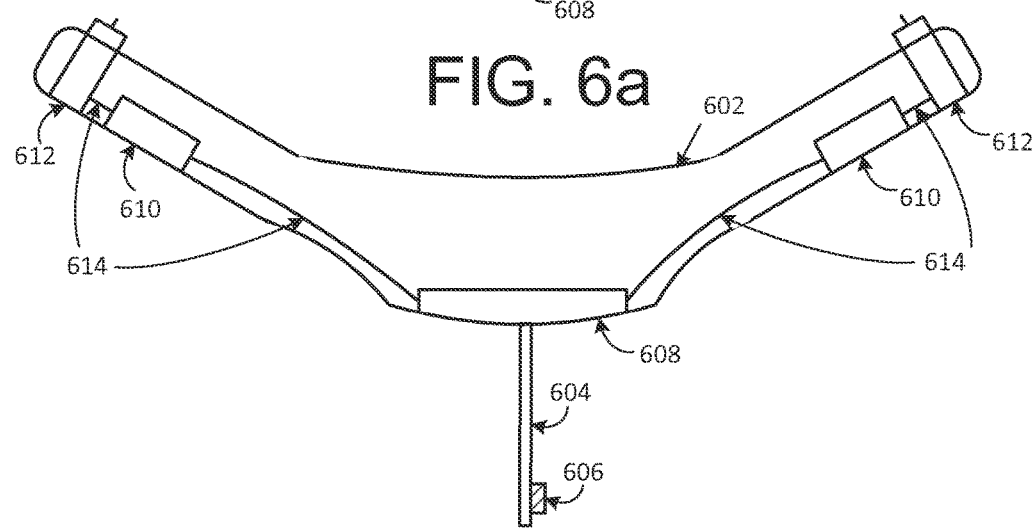
Figure 6C:
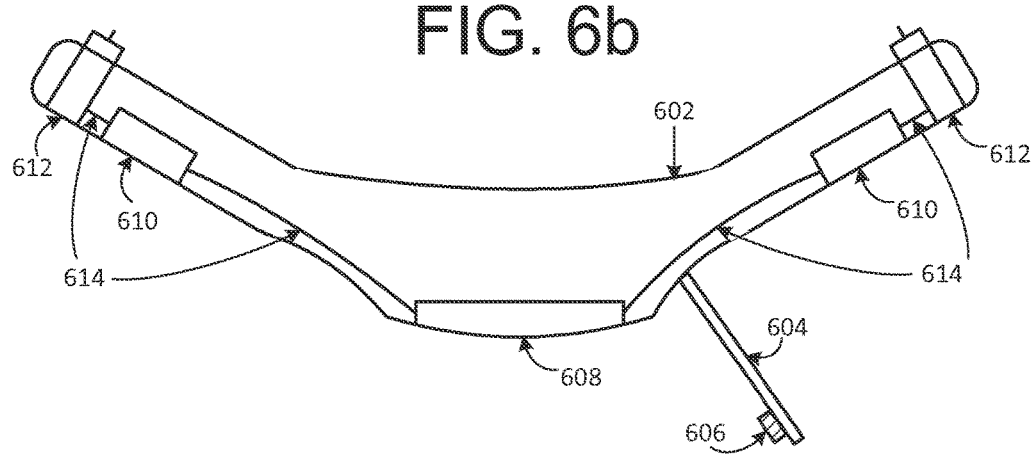

The illustrated example shows the extension member attached to the upper portion of the UAV body. In other embodiments, the extension member can be attached to the outer surface at other locations. FIGS. 6b-c illustrate some of such embodiments. In some embodiments, such as illustrated by FIG. 6b, the extension member 604 may be attached to a lower portion of the body and extends away from the cavity. In some other embodiments, such as illustrated by FIG. 6c, the extension member 604 may attached to a side portion of the body and extends away from the cavity. In other embodiments, the extension member may be attached to other locations not illustrated herein. In some embodiments, more than one interference-susceptible sensor may be provided for one UAV. In such embodiments, the sensors may be located on one or more extension members such as illustrated here. In some embodiments, multiple extension members may be attached to different portions of the outer surface of the UAV body.

In some embodiments, the extension member may be attached to the inner surface of the body portion. In such an embodiment, the extension member may or may not be also attached to the outer surface of the body portion. For example, in an embodiment, the extension member may pass through and be in contact with both the inner surface and the outer surface of the body portion. In another embodiment, the extension member may be attached to only the inner surface of the body portion and extends away from the cavity without being in contact with the outer surface (e.g., by passing through without touching an opening on the body portion of the UAV).

Figure 7A:
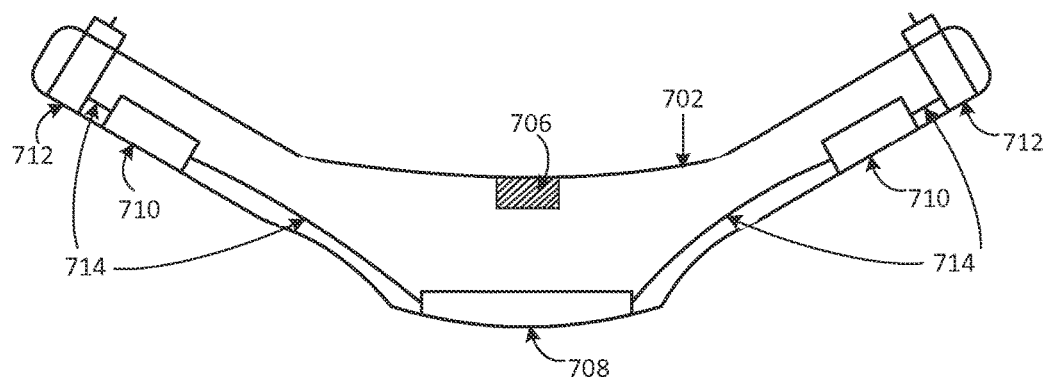
FIGS. 7a-c illustrate example UAVs where a sensor is located on an inner or outer surface of the body of the UAVs, in accordance with some embodiments.
Figure 7B:
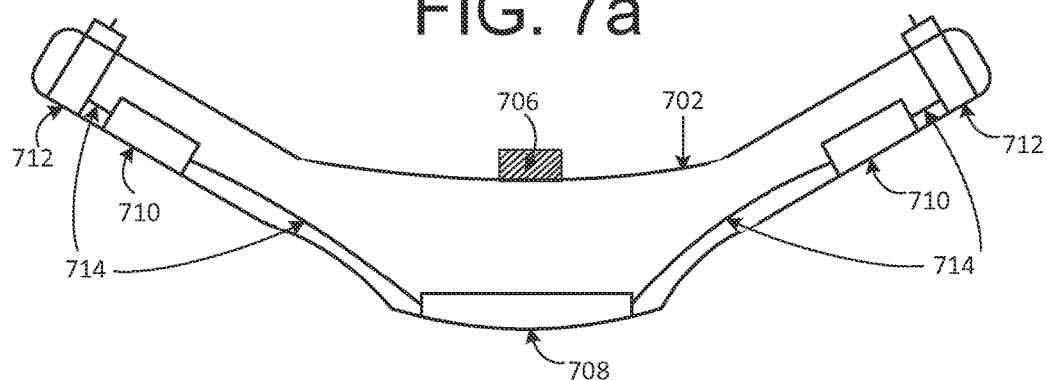
Figure 7C:
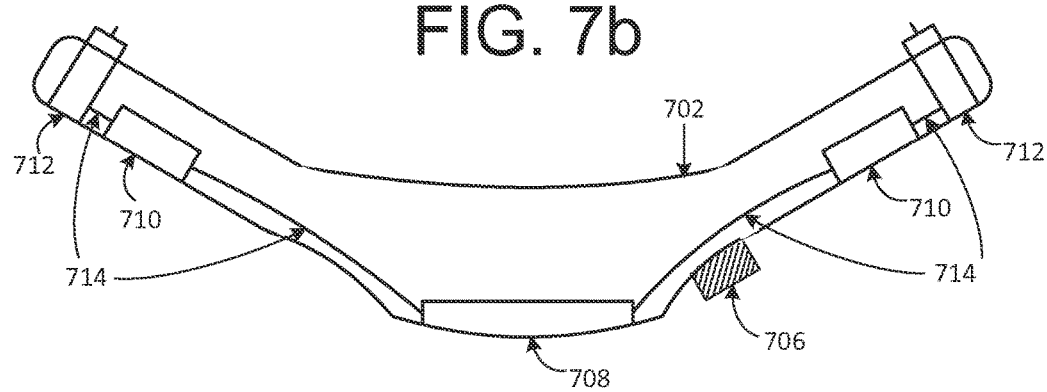

In some embodiments, instead of or in addition to using extension member, the interference-susceptible sensor may be attached directly to the inner or outer surface of the body of the UAV and away from the interference-generating electrical components. FIGS. 7a-c illustrate a side view of a UAV along a plane that is substantially orthogonal to the plane formed by the rotors of the UAV, in accordance with some embodiments. In these figures, the body 702, interference-susceptible sensor 706 and the interference-generating electrical components 708, 710, 712 and 714 may be similar to the body 602, interference-susceptible sensor 606 and the electrical components 608, 610, 612 and 614 discussed in connection with FIG. 6. However, in FIGS. 7a-c, the interference-susceptible sensor 706 is located directly on an inner or outer surface of the UAV body without the use of an extension member. In some embodiments, such as illustrated by FIG. 7a, interference-susceptible sensor 706 may be located directly on an inner surface that is on the same side as the rotor blades (or an upper inner surface of cavity) and away from the various interference-generating electrical components. In some other embodiments, such as illustrated by FIG. 7b, interference-susceptible sensor 706 may be located directly on an outer surface outside the cavity that is on the same side as the rotor blades (or an upper outer surface). In some other embodiments, such as illustrated by FIG. 7c, the interference-susceptible sensor 706 may be located directly on an outer surface that is on opposite side as the rotor blades (or a lower outer surface) and away from the electrical components. In some other embodiments (not shown), the interference-susceptible sensor may be located directly on an inner surface that is on the opposite side as the rotor blades (or a lower inner surface) and away from the electrical components.

Figure 8A:
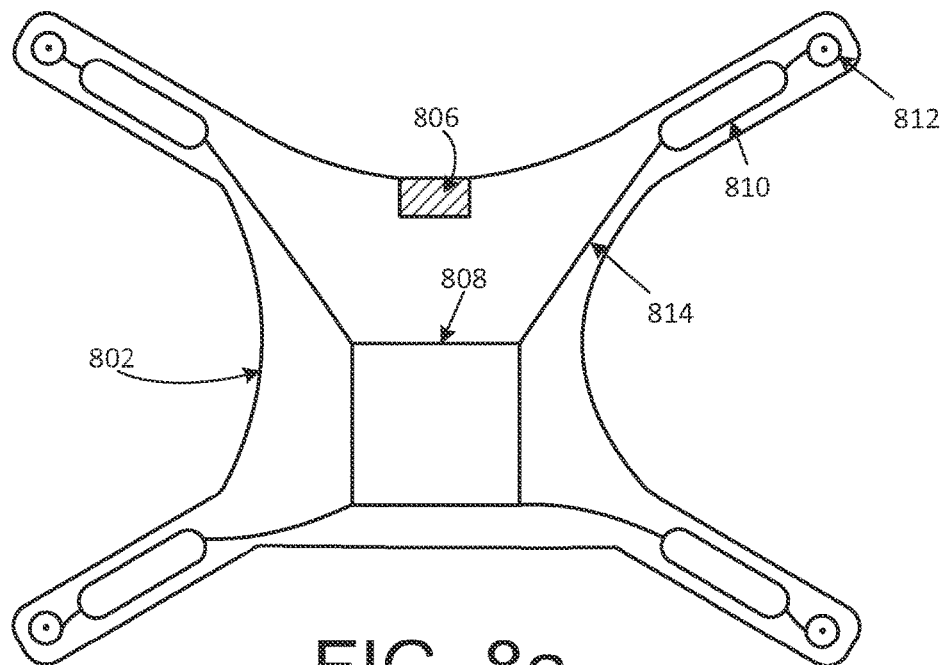
FIGS. 8a-b illustrate more examples where a sensor is located on an inner or outer surface of the body of the UAVs, in accordance with some embodiments.
Figure 8B:
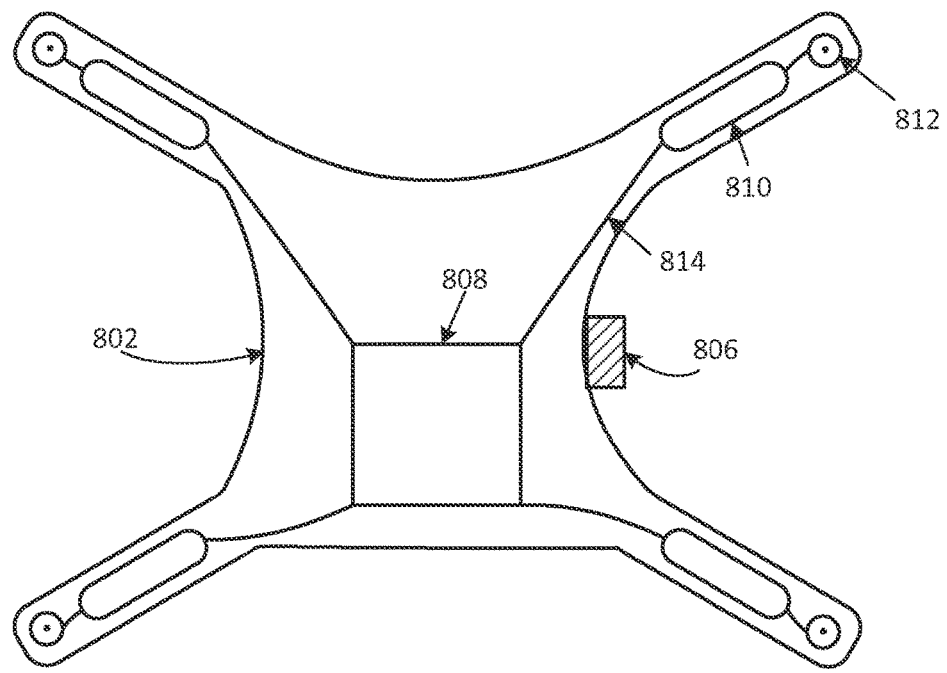

FIGS. 8a-b illustrate a top-down view of some other embodiments wherein the interference-susceptible sensor is directly attached to an inner or outer surface of the UAV. However, unlike the embodiments shown in FIGS. 7a-c, the illustrated views are along plane that is substantially parallel to the plane formed by the rotors of the UAV. As shown, the body 802, interference-susceptible sensor 806 and the interference-generating electrical components 808, 810, 812 and 814 may be similar to the body 702, interference-susceptible sensor 706 and the electrical components 708, 710, 712 and 714 discussed in connection with FIGS. 7a-c. In some embodiments, such as illustrated by FIG. 8a, the sensor 806 is located along a side inner surface of the body portion of the UAV. In some other embodiments, such as illustrated by FIG. 8b, the sensor 806 is located along a side outer surface of the body portion of the UAV.

In some embodiments, the sensor may be attached on the inner or outer surface of the body of the UAV by a fastener (e.g., strap, wire), glue, welding or the like. In some other embodiments, the sensor may be held in place on such surfaces by receiving structures such as slots, grids and the like. In some other embodiments, the sensor may be merely placed on such surfaces without the use of any fastener or receiving structures. In some embodiments, more than one interference-susceptible sensor may be attached to various locations of the body portion of the UAV with or without extension members. For example, in an embodiment, some of the sensors may be attached to the body portion via extension members while others are directly attached to the inner or outer surface of the UAV body.

In various embodiments, the interference experienced by the interference-susceptible sensor may be measured by field heading deviation and/or the field strength of magnetic interference. Such level of interference may be obtained by comparing the readings of the sensor when the electrical components are powered off and on, respectively. The level of interference, that is, the difference between the on and off readings, can vary when the location of the sensor is varied. In particular, when the distance between the sensor and the electrical components increases, the level of interference can decrease. For example, the heading deviation caused by the interference and/or the strength of the magnetic interference may be weakened. For example, when the sensor and the electrical components are located, respectively, outside and inside the body of the UAV, the heading deviation experienced by the magnetometer may be less, by a certain threshold value, than the heading deviation experienced by the magnetometer when it is inside the body of the UAV. Such threshold value may be around 15 degrees, 10 degrees, 5 degrees or the like. As another example, when the sensor and the electrical components are located, respectively, outside and inside the body of the UAV, the field strength experienced by the magnetometer may be less, by a certain threshold value, than the field strength experienced by the magnetometer when it is inside the body of the UAV. Such threshold value may be around 0.5 gauss, 0.3 gauss, 0.1 gauss, or the like.

In various embodiments, the present invention may be applied to UAVs of different sizes, dimensions and/or configurations. For example, in an embodiment, the present invention can be applied to multi-rotor UAVs where the distance between the shafts of opposing rotors does not exceed a certain threshold value. Such threshold value may be around 5 meters, 4 meters, 3, meters, 2 meters, 1 meter, or the like. For instances, the values of the distance between shafts of opposing rotors may be 350 millimeters, 450 millimeters, 800 millimeters, 900 millimeters and the like.

In some embodiments, the UAV may be of a size and/or dimensions sufficient to accomodate a human occupant within or on the UAV. Alternatively, the UAV may be of size and/or dimensions smaller than that capable of having a human occupant within or on the UAV. In some instances, the UAV may have a maximum dimension (e.g., length, width, height, diameter, diagonal) of no more than 5 m. For example, the distance between shafts of opposing rotors may be no more than 5 m. In some embodiments, the UAV may have a volume of less than 100 cm×100 cm×100 cm. In some embodiments, the UAV may have a volume of less than 50 cm×50 cm×30 cm. In some embodiments, the UAV may have a volume of less than 5 cm×5 cm×3 cm. In some embodiments, the UAV may have a footprint (which may refer to the lateral cross-sectional area encompassed by the UAV) less than about 32,000 $cm^2$, less than about 20,000 $cm^2$, less than about 10,000 $cm^2$, less than about 1,000 $cm^2$, less than about 500 $cm^2$, less than about 100 $cm^2$ or even less. In some instances, the UAV may weigh no more than 1000 kg, no more than 500 kg, no more than 100 kg, no more than 10 kg, no more than 5 kg, no more than 1 kg, or no more than 0.5 kg. In some embodiments, a UAV may be small relative to the load (comprising payload device and/or carrier). In some examples, a ratio of a UAV weight to a load weight may be greater than, less than, or equal to about 1:1. In some instances, a ratio of a UAV weight to a payload weight may be greater than, less than, or equal to about 1:1. Where desired, the a ratio of a UAV weight to a load weight may be 1:2, 1:3, 1:4, or even less. Conversely, the ratio of a UAV weight to a load weight can also be designed to 2:1, 3:1, 4:1, 5:1 or even higher. Optionally, a ratio of a carrier weight to a payload weight may be greater than, less than, or equal to about 1:1. Where desired, the ratio of carrier's weight to payload's weight may 1:2, 1:3, 1:4, or even less.

Conversely, the ratio of carrier's weight to payload's weight may 2:1, 3:1, 4:1, 5:1, or even higher. In some embodiments, the UAV may have low energy consumption. For example, the UAV may use less than 2w/h. In some instances, the carrier may have low energy consumption. For example, the carrier may use less than 2w/h.

In various embodiments, a kit for assembling an unmanned aerial vehicle may be provided. In some embodiments, the kit comprises one or more electrical components adapted to control operation of the UAV, and/or one or more rotor motors of said UAV. The kit also comprises instructions comprising information for a user of said UAV to assemble the above mentioned electrical components with a magnetometer. In an embodiment, a UAV assembled according to the instructions is characterized in that it comprises a housing comprising an outer surface and an inner surface that forms a cavity, disposed inside the cavity, the one or more electric components, and the magnetometer is located outside the housing. In another embodiment, a UAV assembled according to the instructions is characterized in that it comprises a housing comprising an outer surface and an inner surface that forms a cavity, disposed inside the cavity, the one or more electric components, and the magnetometer is located at least about 3 cm away from the one or more electrical components. In another embodiment, a UAV assembled according to the instructions is characterized in that it comprises the one or more electrical component adapted to control operation of the UAV, and/or one or more rotor blades of said UAV and a magnetometer located at least 3 cm away and at most 0.5 m away from the one or more electrical components.

In some embodiments, the kit for assembling the UAV may comprise a magnetometer; and instructions comprising information for a user of said UAV to assemble said magnetometer with one or more electrical components adapted to control operation of the UAV. In an embodiment, a UAV assembled according to the instructions is characterized in that it comprises a housing comprising an outer surface and an inner surface that forms a cavity, disposed inside the cavity, the one or more electric components, and the magnetometer is located outside the housing. In another embodiment, a UAV assembled according to the instructions is characterized in that it comprises a housing comprising an outer surface and an inner surface that forms a cavity, disposed inside the cavity, the one or more electric component, and the magnetometer is located at least about 3 cm away from the one or more electrical component. In another embodiment, a UAV assembled according to the instructions is characterized in that it comprises the one or more electrical component adapted to control operation of the UAV, and/or one or more rotor blades of said UAV and a magnetometer located at least about 3 cm away and at most 0.5 m away from the one or more electrical components.

In some embodiments, the kit for assembling the UAV may comprise a housing comprising an outer surface and an inner surface that forms a cavity, one or more pre-configured electrical components disposed inside the cavity and adapted to control operation of the UAV, a magnetometer, operation of the magnetometer being susceptible to interference from the one or more electrical components, and instructions for assembling said UAV. In an embodiment, when the UAV is assembled according to the instructions, the assembled UAV is characterized in that the magnetometer is located outside the housing. In another embodiment, the assembled UAV is characterized in that the magnetometer is located at least about 3 cm away from the one or more electrical component. In another embodiment, the assembled UAV is characterized in that the magnetometer is located at most 0.5 m away from the one or more electrical components.

In some embodiments, the kit for assembling a UAV may further comprise an extension member that is attachable to the outer surface of the cavity and the assembled UAV is further characterized in that the extension member is attached to the outer surface of the housing and the magnetometer is located on the extension member.

According to another aspect of the present invention, methods for assembling a UAV are provided. In some embodiments, the method of assembling an unmanned aerial vehicle may comprise following instructions provided in a kit comprising one or more electrical components adapted to control operation of the UAV, and/or one or more rotor blades of said UAV, thereby assembling said UAV. In an embodiment, said UAV when assembled is characterized in that it comprises a housing comprising an outer surface and an inner surface that forms a cavity, disposed inside the cavity, the one or more electric components, and the magnetometer is located outside the housing. In another embodiment, said UAV when assembled is characterized in that it comprises a housing comprising an outer surface and an inner surface that forms a cavity, disposed inside the cavity, the one or more electric components, and the magnetometer is located at least about 3 cm away from the one or more electrical components. In another embodiment, said UAV when assembled is characterized in that it comprises the one or more electrical component adapted to control operation of the UAV, and/or one or more rotor blades of said UAV and a magnetometer located at least about 3 cm away and at most 0.5 m away from the one or more electrical components.

In some embodiments, the method of assembling an unmanned aerial vehicle may comprise following instructions provided in a kit comprising a magnetometer to incorporate said magnetometer into said UAV, thereby assembling said UAV. In an embodiment, said UAV when assembled is characterized in that it comprises a housing comprising an outer surface and an inner surface that forms a cavity, disposed inside the cavity, the one or more electric components, and the magnetometer is located outside the housing. In another embodiment, said UAV when assembled is characterized in that it comprises a housing comprising an outer surface and an inner surface that forms a cavity, disposed inside the cavity, the one or more electric components, and the magnetometer is located at least about 3 cm away from the one or more electrical component. In another embodiment, said UAV when assembled is characterized in that it comprises the one or more electrical components adapted to control operation of the UAV, and/or one or more rotor blades of said UAV and a magnetometer located at least about 3 cm away and at most 0.5 m away from the one or more electrical components.

In some embodiments, the step of following instructions comprises connecting one or more rotor blades to the one or more electrical components such that they are electrically coupled to each other. In some embodiments, the said step further comprising placing said magnetometer at a position on said UAV where said magnetometer does not experience significant electromagnetic interference from said one or more electrical components.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A multi-rotor unmanned aerial vehicle (UAV), comprising:
    a central body comprising an upper housing member and a lower housing member, the upper housing member and the lower housing member forming a central cavity, wherein the central cavity is configured to house one or more electrical components configured to control the operation of the UAV;
    one or more branch housing members extending from the central body, the one or more branch housing members each comprising an upper branch housing member and a lower branch housing member, and
    one or more electrical components disposed inside the central cavity, wherein the one or more electrical components (1) are configured to control the operation of the UAV, and (2) comprise at least a flight control module and an inertial measurement unit (IMU);
    a magnetometer attached onto a landing stand at a position sufficiently distal from the one or more electrical components to effect a reduction of interference from said one or more electrical components, wherein the landing stand extends away from the body of the UAV and is configured to bear weight of the UAV when the UAV is not airborne;
    wherein the one or more branch housing members are configured to support one or more actuator assemblies, each actuator assembly comprising an actuator configured to effect movement of the UAV, wherein the thrust of the one or more actuator assemblies is oriented in a vertical direction relative to the central body, and
    wherein at least a portion of each of the lower branch housing members extends beneath at least a portion of the corresponding actuator.

2. The UAV of claim 1, wherein the one or more upper branch housing members and the upper housing member form an integral upper body portion, the one or more lower branch housing members and the lower housing member form an integral lower body portion, and the integral upper body portion and the integral lower body portion are removably coupled to form a hollow body portion comprising the central cavity.

3. The UAV of claim 2, wherein the magnetometer is at a distance of more than 3 cm and no more than 0.5 m away from the one or more electrical components.

4. The UAV of claim 1, wherein the upper branch housing member and the lower branch housing member form a branch cavity within a corresponding branch housing member.

5. The UAV of claim 4, further comprising one or more electronic speed control (ESC) modules, each electrically coupled to a corresponding actuator assembly of the one or more actuator assemblies in order to control actuation of said corresponding actuator assembly.

6. The UAV of claim 5, wherein the one or more ESC modules each is located within a corresponding branch housing member.

7. The UAV of claim 5, wherein the upper branch housing member and the lower branch housing member have substantially the same length.

8. The UAV of claim 5, wherein each ESC module of the one or more ESC modules is electrically connected to the flight control module and the corresponding actuator assembly, wherein the flight control module is configured to provide control signals for the ESC modules, and wherein each ESC module is configured to provide actuator signals to the corresponding actuator assembly.

9. The UAV of claim 8, wherein each ESC module of the one or more ESC modules is operably connected to the flight control module to permit two-way communication between the flight control module and each ESC module.

10. The UAV of claim 1, wherein the central cavity has one or more interior structures formed therein configured to accommodate the one or more electrical components.

11. The UAV of claim 10, wherein the interior structures comprise slots, grids, or housings that accommodate the one or more electrical components.

12. The UAV of claim 1, further comprising an energy source located with the central cavity, and configured to provide energy to the one or more actuator assemblies.

13. The UAV of claim 12, further comprising an opening configured to permit the energy source to be retrieved from the central cavity or inserted into the central cavity.

14. The UAV of claim 13, further comprising a cover hingedly coupled to the central body to selectively cover the opening.

15. The UAV of claim 1, further comprising a carrier for supporting a payload device.

16. The UAV of claim 1, wherein the magnetometer comprises a compass.

17. The UAV of claim 1, wherein each actuator assembly comprises a rotor blade and an actuator configured to actuate the rotor blade.

18. The UAV of claim 1, further comprising an indicator light source, wherein the indicator light source is positioned at an opening or window.

19. The UAV of claim 18, wherein the opening or the window is made of a transparent or semi-transparent material.

* * * * *